(12) United States Patent
Ohta et al.

(10) Patent No.: US 6,271,677 B1
(45) Date of Patent: Aug. 7, 2001

(54) SEMICONDUCTOR INTEGRATED CIRCUIT AND METHOD FOR TESTING THE SEMICONDUCTOR INTEGRATED CIRCUIT

(75) Inventors: Mitsuyasu Ohta; Toshinori Hosokawa; Sadami Takeoka; Osamu Ichikawa, all of Osaka (JP)

(73) Assignee: Matsushita Electric Industrial Company, Limited, Osaka (JP)

( * ) Notice: Subject to any disclaimer, the term of this patent is extended or adjusted under 35 U.S.C. 154(b) by 0 days.

(21) Appl. No.: 09/560,126

(22) Filed: Apr. 28, 2000

(30) Foreign Application Priority Data

Apr. 28, 1999 (JP) .................................................. 11-122800

(51) Int. Cl.[7] .................................................. H03K 19/00
(52) U.S. Cl. .................................. 326/16; 326/9; 326/14
(58) Field of Search ..................................... 326/16, 9, 14

(56) References Cited

U.S. PATENT DOCUMENTS

| 4,821,256 | * | 4/1989 | Schmidth et al. | ...................... 370/13 |
| 5,483,543 | * | 1/1996 | Hosokawa et al. | ...................... 371/23 |
| 5,828,828 | * | 10/1998 | Lin et al. | ...................... 395/183.06 |

FOREIGN PATENT DOCUMENTS 5-249186  9/1993  (JP) .

OTHER PUBLICATIONS

Kwang–Ting Cheng and Hsi–Chuan Chen, Delay Testing For Non–Robust Untestable Circuits, 1993, pp. 954–961.

* cited by examiner

*Primary Examiner*—Michael Tokar
*Assistant Examiner*—Anh Q. Tran
(74) *Attorney, Agent, or Firm*—Wenderoth, Lind & Ponack, L.L.P.

(57) ABSTRACT

A semiconductor IC includes a test circuit comprising a logic circuit, a test timing generator, a first register serving as a test signal generation point, and second and third registers serving as test signal observation points. In this test circuit, a target signal transmission path to be tested is selected from a plurality of signal transmission paths in the logic circuit, and the test timing generator outputs a test clock having a cycle according to a delay time of the selected signal transmission path on design to the first to third registers, whereby the first register generates a test signal and the second and third registers observe the test signal. Therefore, the signal transmission paths connecting the test signal generation point and the test signal observation point are tested with high efficiency, whereby more signal transmission paths are tested for delay faults with less number of times the test is executed.

27 Claims, 11 Drawing Sheets

SEMICONDUCTOR INTEGRATED CIRCUIT AND METHOD FOR TESTING THE SEMICONDUCTOR INTEGRATED CIRCUIT

FIELD OF THE INVENTION

The present invention relates to a semiconductor integrated circuit (hereinafter referred to as "semiconductor IC") having a circuit structure for detecting whether there is any fault by which a delay in a signal transmission path increases and the IC cannot provide expected performance (delay fault), and a method for testing the semiconductor integrated circuit.

BACKGROUND OF THE INVENTION

In recent years, with increase in integration density of semiconductor ICs, elements and lines constituting the semiconductor ICs have been fined and densified. On the other hand, with increase in processing speed, higher operation frequency is required of the semiconductor ICs.

Consequently, a margin relating to a signal delay which occurs in a signal transmission path between registers as components of a semiconductor IC is reduced and, therefore, it is important to test a manufactured semiconductor IC as to whether it can provide expected performance or not, by detecting the presence of a delay fault in the signal transmission path.

For example, Japanese Published Patent Application No. Hei.5-249186 disclosed a method for testing a logic circuit, in which a test signal generation point and a test signal observation point are provided at the starting point and the end point of a signal transmission path in a semiconductor IC, respectively, to detect the presence of a delay fault in the signal transmission path.

FIG. 10 is a diagram for explaining a conventional method for testing signal transmission paths, schematically illustrating a circuit to be tested in a semiconductor IC, and a tester used for the test.

The semiconductor IC comprises a logic circuit 9003 having a plurality of signal transmission paths, a logic circuit 9001 providing test signal generation points for detecting whether delay faults exist in the signal transmission paths or not, and a logic circuit 9002 providing test signal observation points for detecting whether delay faults exist in the signal transmission paths.

The logic circuit 9001 includes first, second, and third registers (Level Sensitive Scan Design (LSSD)) 91, 92, and 93 each comprising a master latch L1 and a slave latch L2, and these registers 91~93 are used as shift registers when performing the test. The register 91 serves as a generation point of a test signal for detecting whether delay faults exist in the signal transmission paths in the logic circuit 9003, and the registers 92 and 93 serve as generation points of signals for activating target signal transmission paths to be tested. The test signal generated by the register 91 is output to the target signal transmission paths activated by the signals from the registers 92 and 93.

Likewise, the logic circuit 9002 includes first, second, and third registers (LSSD) 94, 95, and 96 each comprising a master latch L1 and a slave latch L2, and these registers 94~96 serve as observation points for observing the test signal transmitted through the target signal transmission paths, thereby detecting whether delay faults exist in the signal transmission paths in the logic circuit 9003.

In FIG. 10, SYS data is data in a normal operation mode, and this SYS data is latched into the register L1 by a clock A. Further, a scan data input (test signal) is latched into the register L1 by a clock C1. Further, data from the register L1 is latched into the register L2 by a clock C2.

The tester 9100 outputs the clocks C1 and C2 at predetermined timings, and decides whether the target signal transmission paths have passed the test or not. To be specific, a signal which is set in the logic circuit 9001 from the scan data input by scanning is changed, influence of this change is observed by the logic circuit 9002, the signal received at the logic circuit 9002 is output to the scan data output b by scanning, and the output value is compared with an output value which has previously been obtained in a normal circuit.

In the above-described method using the conventional test circuit, changes of the test signals generated in the registers 91~93 (test signal generation points) are latched by the registers 94~96 (test signal observation points) after one system clock cycle, and the changes of the test signals at the observation points are compared with the changes of the test signals at the generation points, thereby deciding whether delay faults which affect the performance of the IC exist in the signal transmission paths.

In the conventional method, however, as the number of the signal transmission paths included in the logic circuit 9003 increases, the number of the target signal transmission paths to be tested, which connect the registers serving as the test signal generation points with the registers serving as the test signal observation points, also increases.

Hereinafter, increase in the number of the target signal transmission paths to be tested will be described using a test circuit 900 shown in FIG. 11.

The test circuit 900 shown in FIG. 11 comprises a logic circuit 900a having signal transmission paths to be tested, a register 9017 forming a test signal generation point which generates a test signal to be input to the logic circuit 900a, and a register 9018 forming a test signal observation point which observes the test signal output from the logic circuit 900a. The register 9017 corresponds to the register 91 shown in FIG. 10, and the register 9018 corresponds to the register 94 shown in FIG. 10.

The logic circuit 900a comprises a logic element 9016 forming a re-convergence point at which the test signal re-converges, partial paths 9010, 9011, and 9012 which are positioned between the logic element 9016 and the test signal generation point 9017, and partial paths 9013, 9014, and 9015 which are positioned between the logic element 9016 and the test signal observation point 9018.

In this test circuit 900, the signal transmission path branches into the three partial paths 9010, 9011, and 9012 at the register 9017 serving as the test signal generation point, and these three partial paths re-converge at the logic element 9016. Further, the signal transmission path branches into the three partial paths 9013, 9014, and 9015 at the logic element 9016 serving as the re-convergence point, and these paths converge again at a point just before the test signal observation point 9018. Generally, signal transmission lines and combinational logic elements exist in the partial paths and the logic element serving as the re-convergence point, these are omitted in FIG. 11 to simplify the description.

By the way, although the number of the partial paths positioned between the test signal generation point and the test signal observation point is only six (9010~9015), the number of the signal transmission paths formed between the generation point and the observation point is equal to the number of combinations of the partial paths between the generation point and the logic element and the partial paths between the logic element and the observation point.

To be specific, in the test circuit, there are nine (first to ninth) signal transmission paths as follows.

That is, the first path comprises the partial path 9010, the logic element 9016, and the partial path 9013. The second path comprises the partial path 9010, the logic element 9016, and the partial path 9014. The third path comprises the partial path 9010, the logic element 9016, and the partial path 9015. The fourth path comprises the partial path 9011, the logic element 9016, and the partial path 9013. The fifth path comprises the partial path 9011, the logic element 9016, and the partial path 9014. The sixth path comprises the partial path 9011, the logic element 9016, and the partial path 9015. The seventh path comprises the partial path 9012, the logic element 9016, and the partial path 9013. The eighth path comprises the partial path 9012, the logic element 9016, and the partial path 9014. The ninth path comprises the partial path 9012, the logic element 9016, and the partial path 9015.

In FIG. 11, for simplification, the test circuit 900 includes one test signal generation point and one test signal observation point. However, when the test circuit includes plural test signal generation points and plural test signal observation points and a signal transmission path between one generation point and one observation point partially overlaps a signal transmission path between another generation point and another observation point, the number of the signal transmission paths increases furthermore.

It is apparent that the increase in the number of signal transmission paths is caused by branching and re-convergence.

Therefore, in the conventional method of testing a semiconductor IC as to whether there exists a delay fault which affects the performance of the IC, either a test which requires considerable time to check all of the signal transmission paths or an insufficient test for only part of the signal transmission paths, has been performed.

SUMMARY OF THE INVENTION

The present invention is made to solve the above-described problems and it is an object of the present invention to provide a semiconductor IC in which more signal transmission paths can be tested about delay faults with less number of times the test is executed, by efficiently testing the signal transmission paths connecting the test signal generation points and the test signal observation points.

Other objects and advantages of the present invention will become apparatus from the detailed description that follows. The detailed description and specific embodiments described are provided only for illustration since various additions and modifications within the scope of the invention will be apparent to those of skill in the art from the detailed description.

According to a first aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises delay decision step of inputting the timing signal to registers on the starting point side and the end point side of a target signal transmission path to be subjected to the test, at an interval according to a delay time on design which is set for the target signal transmission path, and deciding whether or not a test signal generated in the starting-point-side register has been transmitted to the end-point-side register within the delay time on design; fault decision step of deciding that all of partial paths which are components of the target signal transmission path and are separated by a logic element on the path, are not faulty when the test signal has reached the end-point-side register within the delay time on design; and already-tested-path decision step of deciding that an untested signal transmission path comprising only the partial paths which have been decided as being not faulty is an already-tested signal transmission path for which no test is required.

According to a second aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises path selection step of selecting an untested signal transmission path which has not yet been subjected to the test, as a target signal transmission path, from a predetermined number of signal transmission paths to be subjected to the test which are positioned between the two registers; delay decision step of inputting the timing signal to registers on the starting point side and the end point side of the target signal transmission path, at an interval according to a delay time on design which is set for the target signal transmission path, and detecting whether or not a test signal generated in the starting-point-side register has been transmitted to the end-point-side register within the delay time on design, and deciding that the target signal transmission path is an already-tested signal transmission path; fault decision step of deciding that the semiconductor IC has a fault in the target signal transmission path and terminating the test when the test signal has not reached the end-point-side register within the delay time on design, and deciding that all of partial paths which are components of the target signal transmission path and are separated by a logic element on the path, are not faulty when the test signal has reached the end-point-side register within the delay time on design; and already-tested-path decision step of deciding that, amongst the plural signal transmission paths to be subjected to the test, an untested signal transmission path comprising only the partial paths which have been decided as being not faulty is an already-tested signal transmission path for which no test is required. In this method, the path selection step, the delay decision step, the fault decision step, and the tested-path decision step are repeated until all of the predetermined number of signal transmission paths to be subjected to the test have been decided as already-tested signal transmission paths.

According to a third aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises delay decision step of detecting whether or not a test signal generated in a starting-point-side register of a target signal transmission path to be subjected to the test has been transmitted to an end-point-side register within an allowable delay time based on the performance of the semiconductor IC on design; maximum delay time derivation step of deriving maximum delay times for partial paths which are components of the target signal transmission path and are separated by a logic element on the path, on the basis of the allowable delay time and the delay times of the respective partial paths on design, when the test signal has reached the end-point-side register within the allowable delay time; and already-tested-path decision step of deciding that an untested signal transmission path which comprises only the partial paths to which the maximum delay times are assigned and has the sum of the maximum delay times of the respective partial paths being shorter than the allowable delay time, is an already-tested signal transmission path for which no test is required.

According to a fourth aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises path selection step of selecting an untested signal transmission path which has not yet been subjected to the test, as a target signal transmission path, from a predetermined number of signal transmission paths to be subjected to the test which are positioned between the two registers; delay decision step of detecting whether or not a test signal generated in a starting-point-side register of the target signal transmission path has been transmitted to an end-point-side register within an allowable delay time based on the performance of the semiconductor IC on design, and deciding that the target signal transmission path is an already-tested signal transmission path; maximum delay time derivation step of deciding that the semiconductor IC has a fault in the target signal transmission path and terminating the test when the test signal has not reached the end-point-side register within the allowable delay time, and deriving maximum delay times for partial paths which are components of the target signal transmission path and are separated by a logic element on the path, on the basis of the allowable delay time and the delay times of the respective partial paths on design, when the test signal has reached the end-point-side register within the allowable delay time; delay time assignment step of assigning the derived maximum delay time to the partial path whose maximum delay time derived is smaller than a maximum delay time which has already been assigned or to the partial path to which no maximum delay time has not yet been assigned, amongst the partial paths constituting the target signal transmission path; and already-tested-path decision step of deciding that, amongst the plural signal transmission paths to be subjected to the test, an untested signal transmission path which comprises only the partial paths to which the maximum delay times are assigned and has the sum of the maximum delay times of the respective partial paths being shorter than the allowable delay time is an already-tested signal transmission path for which no test is required. In this method, the path selection step, the delay decision step, the maximum delay time derivation step, the delay time assignment step, and the already-tested-path decision step are repeated until all of the predetermined number of signal transmission paths to be subjected to the test have been regarded as already-tested signal transmission paths.

According to a fifth aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises delay decision step of selecting a clock signal as the timing signal from plural clock signals having different cycles, the clock signal having a minimum cycle that is not shorter than a delay time on design which is set for a target signal transmission path to be subjected to the test, and inputting the timing signal to registers on the starting point side and the end point side of the target signal transmission path, and detecting whether or not a test signal generated in the starting-point-side register of the target signal transmission path has been transmitted to the end-point-side register within the minimum cycle; maximum delay time derivation step of deriving maximum delay times for partial paths which are components of the target signal transmission path and are separated by a logic element on the path, on the basis of the minimum cycle and the delay times of the respective partial paths on design, when the test signal has reached the end-point-side register within the minimum cycle; and already-tested-path decision step of deciding that an untested signal transmission path which comprises only the partial paths to which the maximum delay times are assigned and has the sum of the maximum delay times of the respective partial paths being shorter than an allowable delay time based on the performance of the semiconductor IC on design, is an already-tested signal transmission path for which no test is required.

According to a sixth aspect of the present invention, there As provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises path selection step of selecting an untested signal transmission path which has not yet been subjected to the test, as a target signal transmission path, from a predetermined number of signal transmission paths to be subjected to the test, positioned between the two registers; delay decision step of selecting a clock signal as the timing signal from plural clock signals having different cycles, the clock signal having a minimum cycle that is not shorter than a delay time on design which is set for the target signal transmission path, and inputting the timing signal to registers on the starting point side and the end point side of the target signal transmission path, and then detecting whether or not a test signal generated in the starting-point-side register of the target signal transmission path has been transmitted to the end-point-side register within the minimum cycle, and thereafter, deciding that the target signal transmission path is an already-tested signal transmission path; maximum delay time derivation step of deciding that the semiconductor IC has a fault in the target signal transmission path and terminating the test when the test signal has not reached the end-point-side register within the minimum cycle, and deriving maximum delay times for partial paths which are components of the target signal transmission path and are separated by a logic element on the path, on the basis of the minimum cycle and the delay times of the respective partial paths on design, when the test signal has reached the end-point-side register within the minimum cycle; delay time assignment step of assigning the derived maximum delay time to the partial path whose maximum delay time derived is smaller than a maximum delay time which has already been assigned or to the partial path to which no maximum delay time has not yet been assigned, amongst the partial paths constituting the target signal transmission path; and already-tested-path decision step of deciding that, amongst the plural signal transmission paths to be subjected to the test, an untested signal transmission path which comprises only the partial paths to which the maximum delay times are assigned and has the sum of the maximum delay times of the respective partial paths being shorter than an allowable delay time based on the performance of the semiconductor IC on design, is an already-tested signal transmission path for which no test is required. In this method, the path selection step, the delay decision step, the maximum delay time derivation step, the delay time assignment step, and the already-tested-path decision step are repeated until all of the predetermined number of signal transmission paths to be subjected to the test have been regarded as already-tested signal transmission paths.

According to a seventh aspect of the present invention, there is provided a semiconductor IC having a plurality of registers which hold input signals according to a timing signal, and a logic circuit which includes a plurality of signal transmission paths and exchanges signals with predetermined registers. The logic circuit includes a plurality of signal transmission paths positioned between predetermined two registers, and a logic element forming a re-convergence point at which part or all of the plural signal transmission paths re-converge between the two registers; one of the two registers is a starting-point-side register which generates a test signal when performing detection of faults in the signal transmission paths while the other register is an end-point-side register which receives the test signal output from the starting-point-side register through the signal transmission paths; and the logic element is connected with either or both of an additional starting-point-side register which outputs a test signal to the logic element when performing detection of faults in the signal transmission paths and an additional end-point-side register which receives the test signal output from the logic element.

According to an eighth aspect of the present invention, the semiconductor IC of the seventh aspect further includes a test timing generator which outputs a test clock to each of the registers, as a timing signal for deciding a timing at which the starting-point-side register or the additional starting-point-side register generates a test signal and a timing at which the end-point-side register or the additional end-point-side register observes the test signal, and the test timing generator generates a test clock having a predetermined cycle, on the basis of a timing selection signal supplied from the outside.

According to a ninth aspect of the present invention, in the semiconductor IC of the seventh aspect, the logic circuit further includes a starting-point-side delay circuit which comprises a plurality of delay circuits having different delay times and is connected between the logic element forming the re-convergence point and the additional starting-point-side register outputting the test signal to the logic element, and the test signal output from the additional starting-point-side register is transmitted to the logic element through a specific delay circuit in the starting-point-side delay circuit.

According to a tenth aspect of the present invention, in the semiconductor IC of the seventh aspect, the logic circuit further includes an end-point-side delay circuit which comprises a plurality of delay circuits having different delay times and is connected between the logic element forming the re-convergence point and the additional end-point-side register receiving the test signal output from the logic element, and the test signal output from the logic element is transmitted to the additional end-point-side register through a specific delay circuit in the end-point-side delay circuit.

According to an eleventh aspect of the present invention, in the semiconductor IC testing method according to any of the first to sixth aspects, the semiconductor IC includes, as the logic circuit, a logic circuit having a plurality of signal transmission paths positioned between predetermined two registers, and a logic element forming a re-convergence point at which part or all of the plural signal transmission paths re-converge between the two registers; one of the two registers is a starting-point-side register which generates a test signal when performing detection of faults in the signal transmission paths while the other register is an end-point-side register which receives the test signal output from the starting-point-side register through the signal transmission paths; and the logic element is connected with either or both of an additional starting-point-side register which outputs a test signal to the logic element when performing detection of faults in the signal transmission paths and an additional end-point-side register which receives the test signal output from the logic element. In this method, part or all of the signal transmission paths positioned between the starting-point-side register and the end-point-side register are subjected to the test by using the starting-point-side register, the end-point-side register, and either or both of the additional starting-point-side register and the additional end-point-side register.

According to a twelfth aspect of the present invention, there is provided a method for subjecting the semiconductor IC of the ninth aspect to a test for detecting faults in plural signal transmission paths which are positioned between the starting-point-side register and additional starting-point-side register, and the end-point-side register, and between the starting-point-side register, and the end-point-side register and additional end-point-side register. This method comprises delay decision step of generating a test signal according to a timing signal by the starting-point-side register or the additional starting-point-side register of a target signal transmission path to be subjected to the test, and detecting whether or not the test signal has been transmitted to the end-point-side register or the additional end-point-side register within an allowable delay time based on the performance of the semiconductor IC on design, according to the timing signal; maximum delay time derivation step of deriving maximum delay times for partial paths which are components of the target signal transmission path and are separated at the logic element on the path, on the basis of the allowable delay time and the delay times of the respective partial paths on design, when the test signal has been transmitted within the allowable delay time; and already-tested-path decision step of deciding that an untested signal transmission path which comprises only the partial paths to which the maximum delay times are assigned and has the sum of the maximum delay times of the partial paths being shorter than the allowable delay time is an already-tested signal transmission path for which no test is required. In the delay decision step, when generating the test signal by the starting-point-end register, a delay circuit is selected from the starting-point-side delay circuit, and the delay circuit selected has a maximum delay time within a range in which the delay time on design between the additional starting-point-side register and the end-point-side register does not exceed a measured time which is decided according to the timing signal.

According to a thirteenth aspect of the present invention, there is provided a method for subjecting the semiconductor IC of the tenth aspect to a test for detecting faults in plural signal transmission paths which are positioned between the starting-point-side register and additional starting-point-side register, and the end-point-side register, and between the starting-point-side register, and the end-point-side register and additional end-point-side register. This method comprises delay decision step of generating a test signal according to a timing signal by the starting-point-side register or the additional starting-point-side register of a target signal transmission path to be subjected to the test, and detecting whether or not the test signal has been transmitted to the end-point-side register or the additional end-point-side register within an allowable delay time based on the performance of the semiconductor IC on design, according to the timing signal; maximum delay time derivation step of deriving maximum delay times for partial paths which are components of the target signal transmission path and are separated at the logic element on the path, on the basis of the allowable delay time and the delay times of the respective partial paths on design, when the test signal has been transmitted within the allowable delay time; and already-tested-path decision step of deciding that an untested signal transmission path which comprises only the partial paths to which the maximum delay times are assigned and has the sum of the maximum delay times of the partial paths being shorter than the allowable delay time is an already-tested signal transmission path for which no test is required. In this method, the delay decision step, when observing the test signal by the additional end-point-side register, a delay circuit is selected from the end-point-side delay circuit, the delay circuit selected having a maximum delay time within a range in which the delay time on design between the starting-point-side register and the additional end-point-side register does not exceed a measured time which is decided according to the timing signal.

According to a fourteenth aspect of the present invention, there is provided a method for subjecting the semiconductor IC of the ninth aspect to a test for detecting faults in plural signal transmission paths which are positioned between the starting-point-side register and additional starting-point-side register, and the end-point-side register, and between the starting-point-side register, and the end-point-side register and additional end-point-side register. This method comprises delay decision step of selecting a clock signal as a timing signal from plural clock signals having different cycles, the clock signal having a minimum cycle that is not shorter than a delay time on design which is set for a target signal transmission path to be tested, and inputting the timing signal into the starting-point-side and end-point-side registers of the target signal transmission path, and then detecting whether or not the test signal generated in the starting-point-side register or the additional starting-point-side register of the target signal transmission path has been transmitted to the end-point-side register or the additional end-point-side register within the minimum cycle; maximum delay time derivation step of deriving maximum delay times for partial paths which are components of the target signal transmission path and are separated at the logic element on the path, on the basis of the minimum cycle and the delay times of the respective partial paths on design, when the test signal has been transmitted within the minimum cycle; and already-tested-path decision step of deciding that an untested signal transmission path which comprises only the partial paths to which the maximum delay times are assigned and has the sum of the maximum delay times of the partial paths being shorter than an allowable delay time based on the performance of the semiconductor IC on design, is an already-tested signal transmission path for which no test is required. In the delay decision step, when generating the test signal by the starting-point-end register, a delay circuit is selected from the starting-point-side delay circuit, and the delay circuit selected has a maximum delay time within a range in which the delay time on design between the additional starting-point-side register and the end-point-side register does not exceed a measured time which is decided according to the timing signal.

According to a fifteenth aspect of the present invention, there is provided a method for subjecting the semiconductor IC of claim 10 to a test for detecting faults in plural signal transmission paths which are positioned between the starting-point-side register and additional starting-point-side register, and the end-point-side register, and between the starting-point-side register, and the end-point-side register and additional end-point-side register. This method comprises delay decision step of selecting a clock signal as a timing signal from plural clock signals having different cycles, the clock signal having a minimum cycle that is not shorter than a delay time on design which is set for a target signal transmission path to be tested, and inputting the timing signal into the starting-point-side and end-point-side registers of the target signal transmission path, and then detecting whether or not the test signal generated in the starting-point-side register or the additional starting-point-side register of the target signal transmission path has been transmitted to the end-point-side register or the additional end-point-side register within the minimum cycle; maximum delay time derivation step of deriving maximum delay times for partial paths which are components of the target signal transmission path and are separated at the logic element on the path, on the basis of the minimum cycle and the delay times of the respective partial paths on design, when the test signal has been transmitted within the minimum cycle; and already-tested-path decision step of deciding that an untested signal transmission path which comprises only the partial paths to which the maximum delay times are assigned and has the sum of the maximum delay times of the partial paths being shorter than an allowable delay time based on the performance of the semiconductor IC on design, is an already-tested signal transmission path for which no test is required. In the delay decision step, when observing the test signal by the additional end-point-side register, a delay circuit is selected from the end-point-side delay circuit, and the delay circuit selected has a maximum delay time within a range in which the delay time on design between the additional starting-point-side register and the end-point-side register does not exceed a measured time which is decided according to the timing signal.

According to a sixteenth aspect of the present invention, there is provided a semiconductor IC having a plurality of registers which hold input signals according to a timing signal, and a logic circuit which includes a plurality of signal transmission paths and exchanges signals with predetermined registers. The logic circuit includes a plurality of signal transmission paths positioned between predetermined two registers, and a logic element forming a re-convergence point at which part or all of the plural signal transmission paths re-converge between the two registers; and one of the two registers is a starting-point-side register which generates a test signal when performing detection of faults in the signal transmission paths while the other register is an end-point-side register which receives the test signal output from the starting-point-side register through the signal transmission paths. The semiconductor IC further includes a test timing generator for generating a test clock for deciding a timing at which the starting-point-side register generates the test signal and a timing at which the end-point-side register observes the test signal, and outputting the test clock to the respective registers; and the test timing generator generates a test clock of a predetermined frequency on the basis of a timing selection signal supplied from the outside.

According to a seventeenth aspect of the present invention, in the semiconductor IC of the sixteenth aspect, the test timing generator has a plurality of dividers having different division ratios, for dividing a reference clock having a fixed frequency to generate divided clocks; and the test timing generator outputs the reference clock or a divided clock obtained by a predetermined divider, as the test clock, on the basis of the timing selection signal.

According to an eighteenth aspect of the present invention, in the semiconductor IC of the sixteenth aspect, the test timing generator has a plurality of delay circuits having different delay times, for delaying a reference clock having a fixed frequency to generate delayed clocks; and the test timing generator generates a pseudo test clock having a cycle shorter than that of the reference clock, by changing the reference clock or the delayed clock, which is to be output as the test clock, to another delayed clock after rise or fall of the reference clock, according to the timing selection signal.

According to a nineteenth aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises preliminary test step of performing a preliminary test on a pseudo semiconductor IC which is constituted by a computer and has the same structure as that of the semiconductor IC, and regular test step of performing a regular test on the real semiconductor IC, on the basis of the result of the preliminary test. The preliminary test step includes path selection step of selecting an untested signal transmission path which has not yet been tested, as a target signal transmission path, from a predetermined number of signal transmission paths to be tested which are positioned between two registers in the pseudo semiconductor IC; and decision step of deciding that all of partial paths which are components of the target signal transmission path and are separated at a logic element on the path, have no faults, and deciding that an untested signal transmission path comprising only the partial paths having no faults is an already-tested signal transmission path for which no test is required. The regular test step includes delay decision step of inputting a timing signal to registers on the starting point side and the end point side of a signal transmission path in the real semiconductor IC, which corresponds to a signal transmission path in the pseudo semiconductor IC other than the signal transmission path that has been decided as an already-tested path in the decision step of the preliminary test, at an interval according to a delay time on design which is set for the signal transmission path, and detecting whether or not a test signal generated in the starting-point-side register has been transmitted to the end-point-side register within the delay time on design.

According to a twentieth aspect of the present invention, there is provided a method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers. This method comprises preliminary test step of performing a preliminary test on a pseudo semiconductor IC which is constructed by a computer and has the same structure as that of the semiconductor IC, and regular test step of performing a regular test on the real semiconductor IC, on the basis of the result of the preliminary test. The preliminary test step includes path selection step of selecting an untested signal transmission path which has not yet been tested, as a target signal transmission path, from a predetermined number of signal transmission paths to be tested which are positioned between two registers in the pseudo semiconductor IC; maximum delay time derivation step of deriving maximum delay times for partial paths which are components of the target signal transmission path and are separated by a logic element on the path, on the basis of an allowable delay time based on the performance of the semiconductor IC and the delay times of the respective partial paths on design; and decision step of deciding that an untested signal transmission path which comprises only the partial paths to which the maximum delay times are assigned and has the sum of the maximum delay times of the partial paths being shorter than the allowable delay time, is an already-tested signal transmission path for which no test is needed. The regular test step includes delay decision step of inputting a timing signal to registers on the starting point side and the end point side of a signal transmission path in the real semiconductor IC, which corresponds to a signal transmission path in the pseudo semiconductor IC other than the signal transmission path that has been decided as an already-tested path in the decision step of the preliminary test, at an interval according to an allowable delay time based on the performance on design which is set for the signal transmission path, and detecting whether or not a test signal generated in the starting-point-side register has been transmitted to the end-point-side register within the allowable delay time.

According to a twenty-first aspect of the present invention, in the semiconductor IC testing method according to the nineteenth or twentieth aspect, each of the pseudo semiconductor IC and the real semiconductor IC includes, as the logic circuit, a logic circuit having a plurality of signal transmission paths positioned between predetermined two registers, and a logic element forming a re-convergence point at which part or all of the plural signal transmission paths re-converge between the two registers; one of the two registers is a starting-point-side register which generates a test signal when performing detection of faults in the signal transmission paths while the other register is an end-point-side register which receives the test signal output from the starting-point-side register through the signal transmission paths; and the logic element is connected with either or both of an additional starting-point-side register which outputs a test signal to the logic element when performing detection of faults in the signal transmission paths and an additional end-point-side register which receives the test signal output from the logic element.

DETAILED DESCRIPTION OF THE PREFERRED EMBODIMENTS

[Embodiment 1]

Figure 1:
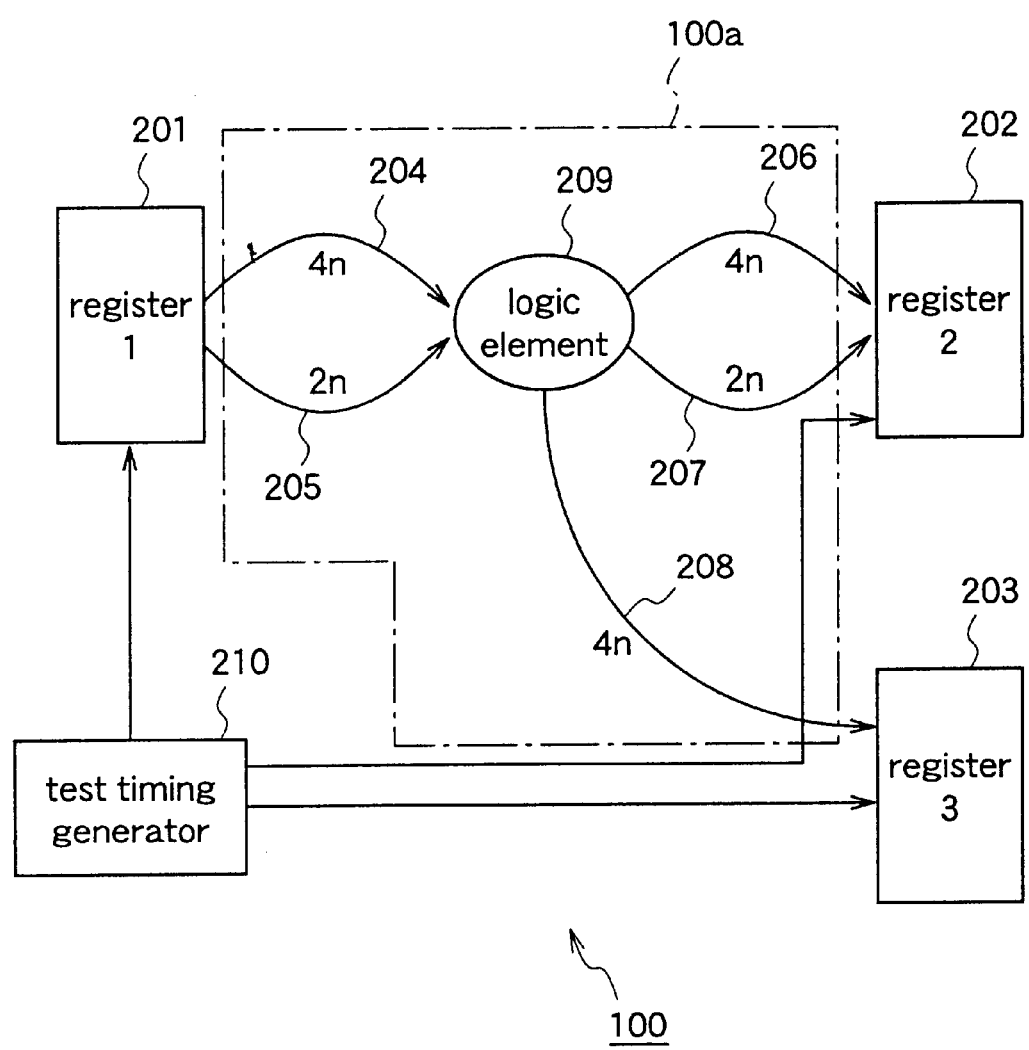
FIG. 1 is a block diagram illustrating a test circuit in a semiconductor IC according to first and second embodiments of the present invention.
Figure 2:
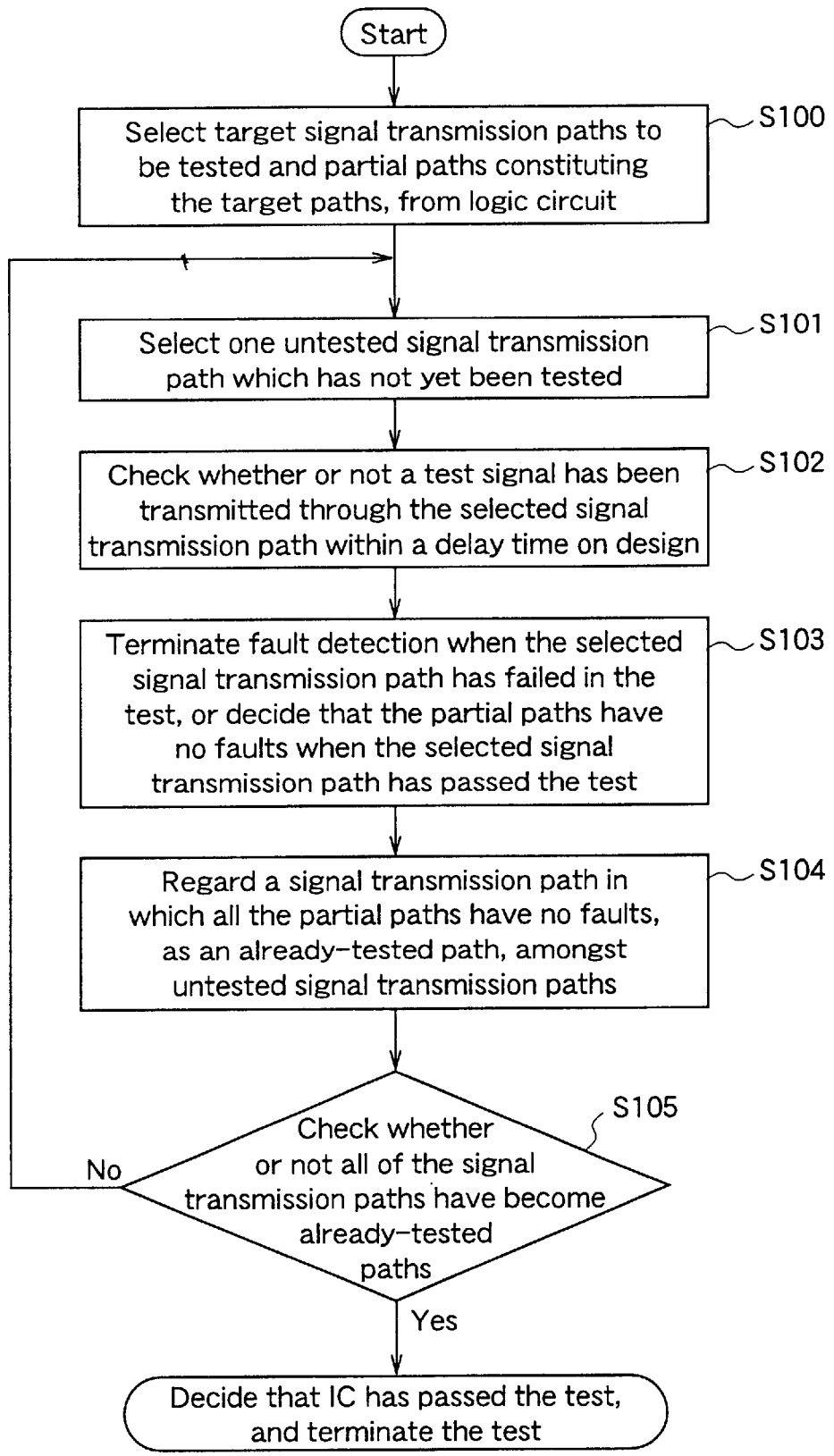
FIG. 2 is a flowchart for explaining a method of testing a semiconductor IC according to the first embodiment.

FIGS. 1 and 2 are diagrams for explaining a semiconductor IC and a method for testing the semiconductor IC according to a first embodiment of the present invention. To be specific, FIG. 1 is a block diagram illustrating a test circuit 100 in the semiconductor IC, which is subjected to a test for delay times in signal transmission paths. FIG. 2 is a flowchart of the test.

The test circuit 100 comprises a logic circuit 100a having signal transmission paths to be tested; a register 201 forming a test signal generation point for generating a test signal to be input to the logic circuit 100a; registers 202 and 203 forming test signal observation points for observing the test signal output from the logic circuit 100a; and a test timing generator 210 for generating test signal clocks which specify operation timings of the test signal generation point and the test signal observation point (i.e., a test signal generation timing and a test signal observation timing).

Further, the logic circuit 100a comprises a logic element forming a re-convergence point of the test signal; partial paths 204 and 205 positioned between the logic circuit 209 and the test signal generation point 201; partial paths 206 and 207 positioned between the logic element 209 and the test signal observation point 202; and a partial path positioned between the logic element 209 and the test signal observation point 203.

In the test circuit 100, the signal transmission path branches into two partial paths 204 and 205 from the test signal generation point 201, and these partial paths 204 and 205 re-converge at the re-convergence point 209. Further, the signal transmission path branches into the three partial paths 206, 207, and 208 from the re-convergence point 209, and the partial paths 206 and 207 again converge at a point just before the test signal observation point 202 while the partial path 208 reaches the test signal observation point 203.

Figure 3:
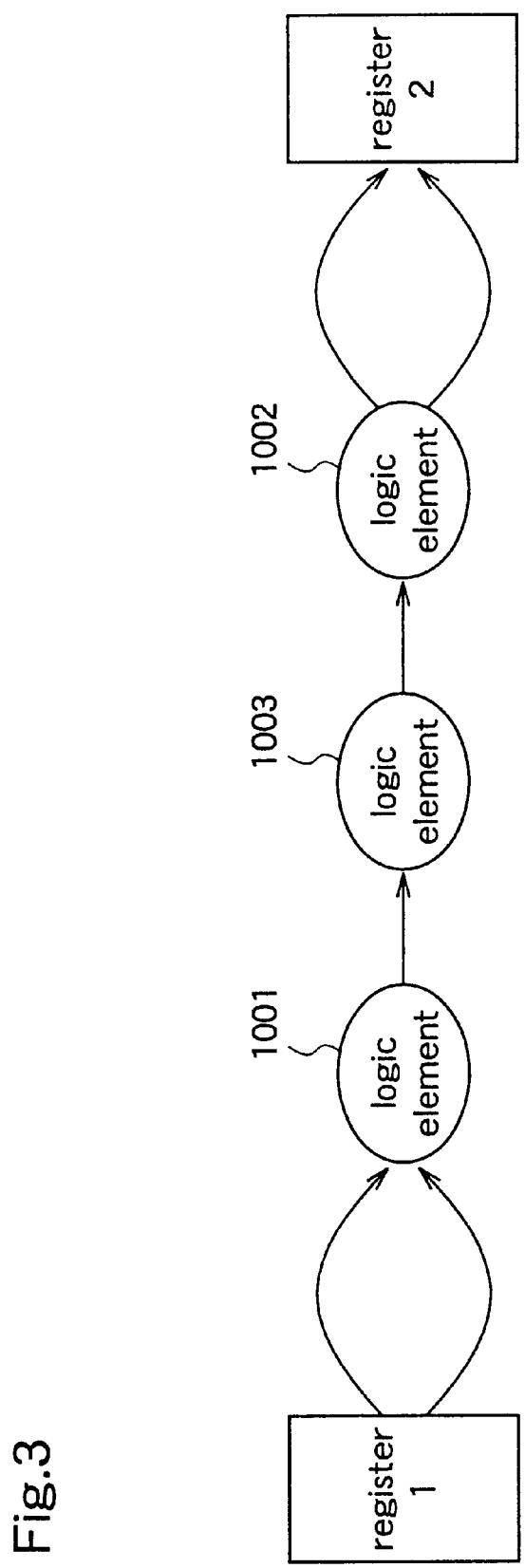
FIG. 3 is a schematic diagram of a semiconductor IC for explaining partial paths of a signal transmission path according to the present invention.

In this first embodiment, the times required for transmitting the test signal through the partial paths 204, 205, 206, 207, and 208 (i.e., the delay times of the respective partial paths on design) are 4 nsec, 2 nsec, 4 nsec, 2 nsec, and 4 nsec, respectively. Generally, as shown in FIG. 3, it is desired that the starting point or the end point of each partial path is any of the starting point and the end point of the signal transmission path, a logic element 1001 at the re-convergence point, a logic element 1002 at the branch point on the output end of the re-convergence point, and a logic element 1003 positioned between the logic elements 1001 and 1002. Further, the respective partial paths and the starting points and end points of the partial paths include signal lines through which signals are transmitted, logic elements, and control signal lines which supply activation signals for activating predetermined partial paths so that the signals transmit through the partial paths. However, these lines and elements are omitted in the figure to simplify the description.

The test timing generator 210 generates a test clock for specifying a timing at which the test signal generation point 201 generates a test signal, and a test clock for specifying a timing at which the test signal observation point 202 observes the state of the signal transmission path. While in this first embodiment the test timing generator 210 is constructed in the semiconductor IC, it may be constructed in an external tester or on a test board. In FIG. 1, the tester is not shown.

Next, the function and effect will be described.

Hereinafter, a description will be given of how the semiconductor IC having the above-described test circuit is tested.

FIG. 2 is a flowchart for explaining the procedure of test. The procedure of test described hereinafter is implemented by a command and a test program of a device (tester) which texts the semiconductor IC, and actual test is performed by the tester.

Initially, signal transmission paths to be tested (hereinafter referred to as target signal transmission paths) are selected from a plurality of signal transmission paths in the semiconductor IC and, further, the selected signal transmission paths are divided at the external input, the external output, or the re-convergence point to decide partial paths which are components of the signal transmission paths (step S100).

In this first embodiment, as the target signal transmission paths, the following six (first to sixth) signal transmission paths are selected. That is, the first signal transmission path comprises the partial path 204, the logic element 209, and the partial path 206. The second signal transmission path comprises the partial path 204, the logic element 209, and the partial path 207. The third signal transmission path comprises the partial path 205, the logic element 209, and the partial path 206. The fourth signal transmission path comprises the partial path 205, the logic element 209, and the partial path 207. The fifth signal transmission path comprises the partial path 204, the logic element 209, and the partial path 208. The sixth signal transmission path comprises the partial path 205, the logic element 209, and the partial path 208.

Accordingly, there are five partial paths 204~208 constituting the above-described six target signal transmission paths.

Next, one signal transmission path which has not yet been tested is selected from the target signal transmission paths. In this first embodiment, it is assumed that the first signal transmission path is selected (step S101).

Then, the selected first signal transmission path is subjected to a test as to whether or not a test signal generated at the test signal generation point 201 has been transmitted to the test signal observation point 202 within a delay time on design (step S102).

To be specific, a test signal is set in the test signal generation point 201 on the basis of the timing of a clock signal supplied from the test timing generator 210 under control of the tester, and the test signal is output from the test signal generation point 201 on the basis of the timing of the clock signal supplied from the test timing generator 210 under control of the tester. Then, the test signal is observed at the test signal observation point 202 on the basis of the timing of the clock signal supplied from the test timing generator 210 under control of the tester.

The observation result is output from the test signal observation point to the external tester immediately or after being temporarily stored in the semiconductor IC. In the external tester, the test signal output from the test signal generation point 201 is compared with the test signal observed at the test signal observation point. However, for simplification, it is assumed that the comparison of the test signals is performed at the test signal observation point, in the following description.

To be specific, it is checked at the test signal observation point 202 as to whether or not the test signal from the test signal generation point 201 has been transmitted to the observation point 202 within a delay time on design of the first signal transmission path, i.e., 8 nsec (=4 nsec+4 nsec).

When the first signal transmission path has failed in the test (i.e., when the test signal has not reached the observation point 202 within the delay time), the test is terminated, regarding the semiconductor IC as defective. On the other hand, when the signal transmission path has passed the test (i.e., when the test signal has reached the observation point within the delay time), it is decided that the partial paths constituting the first signal transmission path selected in step S101 (in this case, the partial paths 204 and 206) have no faults (step 103).

Subsequently, untested signal transmission paths which comprise only the partial paths that have been decided as having no faults in step 5103, are regarded as already-tested signal transmission paths (step S104). In this case, only the first signal transmission path (target signal transmission path) comprising the partial paths 204 and 206 is decided as an already-tested signal transmission path.

Further, in step S105, it is decided whether all of the signal transmission paths have become already-tested paths or not (step S105). When all of the signal transmission paths are already-tested paths, it is decided that the semiconductor IC has passed the test with respect to the object item (delay fault) and is of good quality. On the other hand, when untested signal transmission paths still exist, the processes of steps S101~S105 are repeated. In this case, the procedure returns to step S101 because there are untested signal transmission paths.

Next, it is assumed that the fourth signal transmission path is selected in step S101. Then, in step S102, it is checked whether or not the test signal has been transmitted through this signal transmission path within a delay time of 4 nsec (2 nsec+2 nsec). When the test signal has been transmitted within the delay time, the partial paths 205 and 207 are decided as having no faults in step S103.

Since the partial paths 205 and 207 have been decided as having no faults in step S103, in step S104 the second, third, and fourth signal transmission paths are decided as already-tested paths.

In step S105, it is decided whether all of the signal transmission paths have been decided as already-tested paths or not. When untested signal transmission paths still remain, the procedure returns to step S101.

In step S101, assuming that the fifth signal transmission path is selected, it is checked in step S102 whether or not the test signal has been transmitted through the fifth signal transmission path within a delay time of 8 nsec (4 nsec+4 nsec). When the test signal has been transmitted within the delay time, the partial paths 204 and 208 are decided as having no faults in step S103.

Since the partial path 208 has been newly decided as having no fault in step S103, in step S104 the fifth and sixth signal transmission paths are decided as already-tested paths. Thereby, all of the first to sixth signal transmission paths have been decided as already-tested paths and, therefore, it is decided in step S105 that the semiconductor IC has passed the test with respect to the object item (delay fault), and the test is terminated.

As described above, according to the first embodiment of the present invention, a plurality of target signal transmission paths to be tested are selected from a plurality of signal transmission paths included in the semiconductor IC, and output of a test signal from the test signal generation point and observation of the test signal at the test signal observation signal are performed at timings according to a delay time on design which is set for each signal transmission path selected. Therefore, the selected signal transmission path positioned between the test signal generation point and the test signal observation point can be tested as to whether the test signal has been transmitted through the path within the delay time on design. When detecting that the test signal has been transmitted trough the signal transmission path within the delay time on design, all of the partial paths constituting this signal transmission path are decided as having no faults. As the result, the number of the target signal transmission paths to be tested can be reduced as compared with the conventional testing method wherein all of the signal transmission paths are practically tested.

In this first embodiment, it is decided that the semiconductor IC has passed the test with respect to the object item (delay fault) only when all of the signal transmission paths have been decided as already-tested paths. However, it is needless to say that this decision may be made when a predetermined number of signal transmission paths have been decided as already-tested paths.

Further, while in this first embodiment the number of the signal transmission paths is used as a criterion to decide end of the test, the number of partial paths may be used.

In the case where the test is terminated on the basis of a predetermined number of signal transmission paths, not only the signal transmission paths which have practically been tested but also the signal transmission paths which have been decided as already-tested paths can be confirmed. Therefore, it is possible to accurately grasp the quality of the test (i.e., how many signal transmission paths amongst all the signal transmission paths have been confirmed with respect to signal transmission).

[Embodiment 2]

Figure 4:
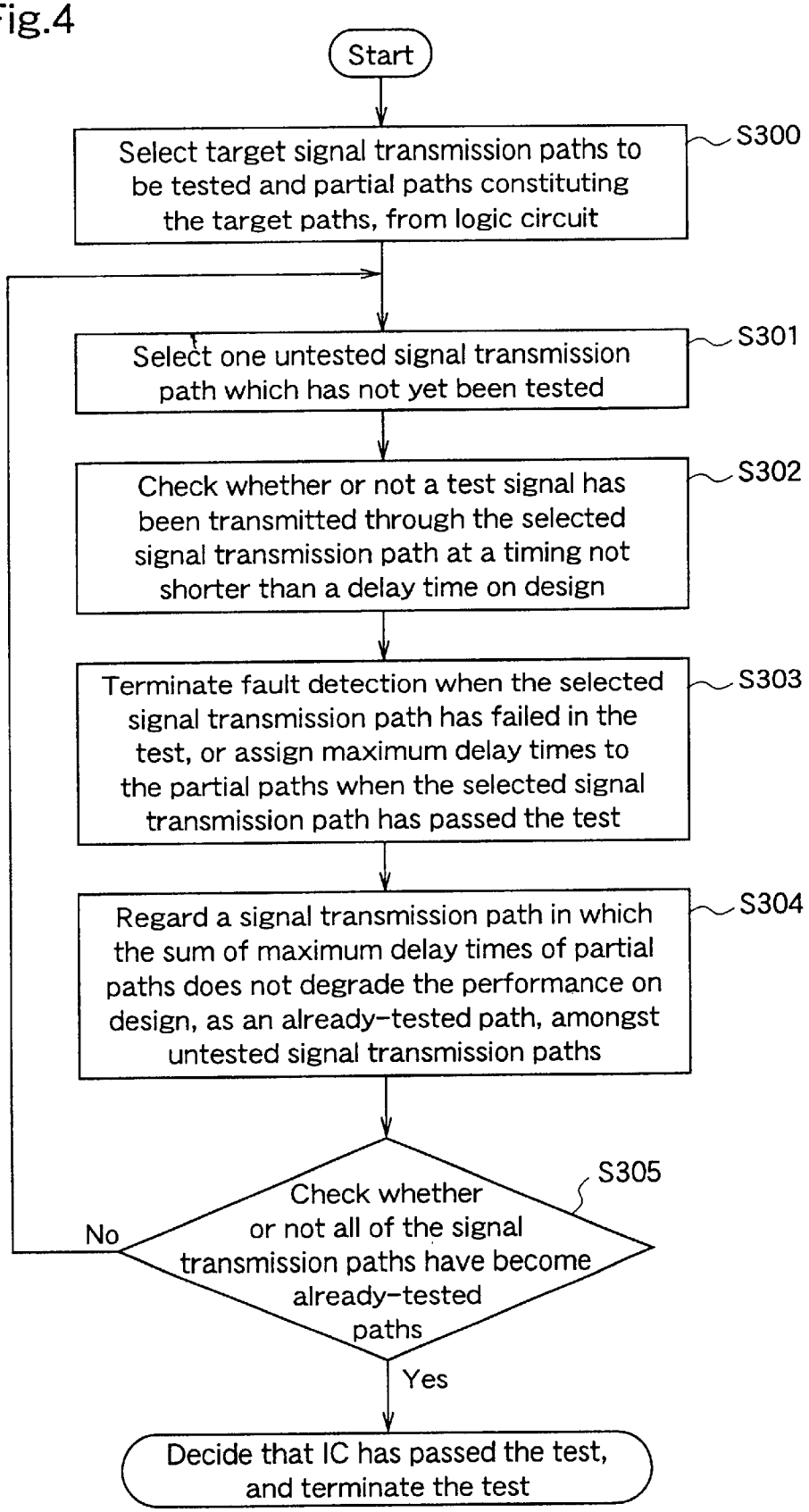
FIG. 4 is a flowchart for explaining a method of testing a semiconductor IC according to the second embodiment.

FIG. 4 is a flowchart for explaining a method of testing a semiconductor IC according to a second embodiment of the present invention.

In this second embodiment, the structure of the semiconductor IC is fundamentally identical to that of the first embodiment except that the semiconductor IC has the performance on design (on practical use) such that it can operate with a clock of 100 MHz. In other words, since the logic circuit 100a is designed such that exchange of data between the registers is performed in one clock cycle, an acceptable time required for signal transmission between the registers is 10 nsec.

Further, the test timing generator 210 is able to generate a clock of 200 MHz (cycle: 5 nsec) and a clock of 100 MHZ (cycle: 10 nsec) as test clocks which specify test timings to the test signal generation point and the test signal observation point.

Figure 5:
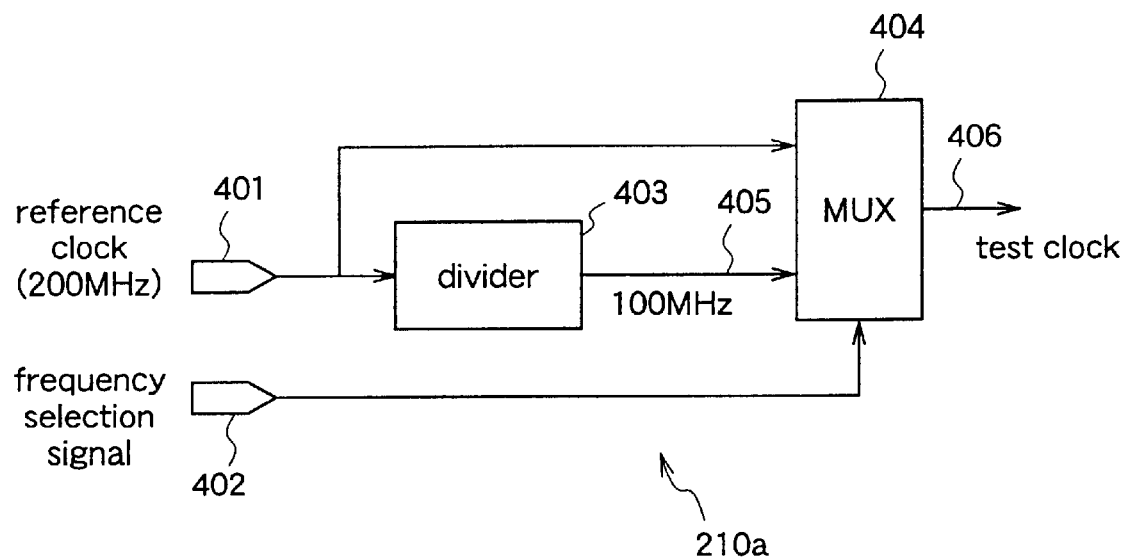
FIG. 5 is a block diagram for explaining a test timing generator as a component of the test circuit according to the second embodiment.

FIG. 5 is a block diagram for explaining the test timing generator 210a mounted on the semiconductor IC according to the second embodiment.

The test timing generator 210a comprises a divider 403 which divides a reference clock 410 of 200 MHz to generate a divided clock 405 of 100 MHz; and a selector 404 which selects either the reference clock 401 or the divided clock 405 according to a frequency selection signal 402 from an external tester or the like, and outputs the selected clock as a test clock 406. Although the test timing generator 210a is constructed in the semiconductor IC, it may be constructed on a test board.

Hereinafter, the test process will be described.

Initially, target signal transmission paths to be tested are selected from a plurality of signal transmission paths in the semiconductor IC, and the selected signal transmission paths are divided at the external input, the external output, or the re-convergence point to decide partial paths which are components of the signal transmission paths (step S300).

In this second embodiment, like the first embodiment, the first to sixth signal transmission paths are selected as target signal transmission paths to be tested. Accordingly, there are five partial paths 204~208 as components of the target signal transmission paths.

Next, one untested signal transmission path is selected from the target signal transmission paths. In this second embodiment, the first signal transmission path is selected (step S301).

Next, in step S302, a test clock, which has a minimum cycle that can be generated in the test timing generator 210a and is longer than a delay time of the first signal transmission path on design, is selected as a timing to generate a test signal at the test signal generation point (register 201) and a timing to observe the test signal at the test signal observation point (register 202), and the selected test clock is output to the test signal generation point and to the test signal observation point. Then, it is checked whether or not the test clock has been transmitted from the test signal generation point to the test signal observation point within the range of the delay time corresponding to one cycle of this test clock. Thereafter, the target signal transmission path is regarded as an already-tested path.

For example, the delay time of the first signal transmission path on design is 8 nsec (4 nsec+4 nsec) as described for the first embodiment. Therefore, in the test timing generator 210a, the test clock of 100 MHz is selected, and it is checked at the test signal observation point 202 whether or not the test signal from the test signal generation point 201 has been transmitted to the observation point 202 within 10 nsec.

When it is decided in step S302 that the first signal transmission path has failed in the test, the test is terminated, regarding the semiconductor IC as faulty (step S303). On the other hand, when it is decided that the first signal transmission path has passed the test, a maximum delay time is obtained for each of the partial paths 204 and 206 which are components of the tested first signal transmission path, with regard to the possibility that the delay time has increased during manufacture. When this maximum delay time is shorter than a maximum delay time which has previously been assigned to each of the partial paths of the target signal transmission path or when a maximum delay time has not yet been assigned to the partial path, the maximum delay time obtained in this test is assigned to the partial path.

To be specific, since the cycle of the test clock is 10 nsec and the delay time of the partial path 206 on design is 4 nsec, 6 nsec (10 nsec−4 nsec) is assigned to the partial path 204. Likewise, 6 nsec is assigned to the partial path 206.

In step S304, an untested signal transmission path (a signal transmission path which has not yet been tested) in which the sum of the maximum delay times assigned to its partial paths is shorter than a delay time which does not degrade the performance of the semiconductor IC on design (in this embodiment, 10 nsec), is regarded as an already-tested signal transmission path. In this second embodiment, when the test on the first signal transmission path has ended, there is no untested signal transmission path to be regarded as an already-tested one.

In step S305, it is decided whether all of the target signal transmission paths have become already-tested signal transmission paths or not. When all of the target signal transmission paths have become already-tested paths, it is decided that the semiconductor IC has passed the test with respect to the object item (delay fault) and is of good quality. On the other hand, when untested signal transmission paths still exist, the above-described processes of steps S301~S305 are repeated. In this case, the procedure returns to step S301 because untested signal transmission paths remain.

In step S301, it is assumed that the fourth signal transmission path is selected.

In step S302, since the delay time of the fourth signal transmission path on design is 4 nsec (2 nsec+2 nsec), the test clock of 200 MHz is selected, and it is checked at the test signal observation point 202 whether or not the test clock has been transmitted from the test signal generation point 201 to the observation point 202 within 5 nsec. Thereafter, the fourth signal transmission path is regarded as an already-tested signal transmission path.

When the fourth signal transmission path has passed the test in step S302, in the next step S303, 3 nsec (5 nsec−2 nsec) is assigned as a maximum delay time to the partial path 205 of the fourth signal transmission path because the cycle of the test clock is 5 nsec and the delay time on design of the partial path 207 of the fourth signal transmission path is 2 nsec. Likewise, 3 nsec is assigned as a maximum delay time to the partial path 207.

In step S304, the sum of the maximum delay times in the second signal transmission path is 9 nsec (=6 nsec (the maximum delay time of the partial path 204)+3 nsec (the maximum delay time of the partial path 207)). Further, the sum of the maximum delay times in the third signal transmission path is 9 nsec (=6 nsec (the maximum delay time of the partial path 205)+3 nsec (the maximum delay time of the partial path 203)). Since each of these sums is shorter than the delay time which does not degrade the performance of the semiconductor IC on design (10 nsec), the second and third signal transmission paths are regarded as already-tested signal transmission paths.

In step S305, it is decided whether all of the target signal transmission paths have become already-tested signal transmission paths or not. In this case, since the fifth and sixth signal transmission paths remain untested, the processes of steps S301~S305 are performed again.

Assuming that the fifth signal transmission path is selected in step S301, it is checked in step S302 whether or not the test clock of 100 MHz (cycle: 10 nsec) has been transmitted within 10 nsec from the test signal generation point through the fifth signal transmission path to the test signal observation point. Thereafter, the fifth signal transmission path is regarded as an already-tested path.

In step S303, since the cycle of the test signal is 10 nsec and the delay time of each of the partial paths 204 and 208 on design is 4 nsec, 6 nsec is assigned as a maximum delay time. At this time, the maximum delay time of 6 nsec is assigned to only the partial path 208 while it is not assigned to the partial path 204 because the maximum delay time (6 nsec) to be assigned is not smaller than the delay time (6 nsec) which has already been assigned to the partial path 204.

In step S304, the sum of the maximum delay times in the sixth signal transmission path is 9 nsec (=3 nsec (the maximum delay time of the partial path 205)+6 nsec (the maximum delay time of the partial path 208). Since the delay time (9 nsec) of the sixth signal transmission path is shorter than the delay time (10 nsec) which does not degrade the performance of the semiconductor IC on design, this sixth signal transmission path is regarded as an already-tested path.

In step S305, since all of the target signal transmission paths have become already-tested signal transmission paths, it is decided that the semiconductor IC has passed the test with respect to the object item (delay fault), and the test is terminated.

As described above, according to the second embodiment of the present invention, a maximum delay time is obtained for each of the partial paths constituting the tested signal transmission path, and only the signal transmission path in which the sum of the maximum delay times of the partial paths is within a range which does not degrade the performance of the semiconductor IC on design is regarded as an already-tested path. Therefore, the number of signal transmission paths to be tested is reduced as compared with the conventional testing method in which all of the signal transmission paths are practically tested.

Further, according to the second embodiment, less kinds of test clocks are required and therefore a cheaper tester can be employed, as compared with the testing method according to the first embodiment.

In this second embodiment, it is decided that the semiconductor IC has passed the test with respect to the object item (delay fault) only when all of the signal transmission paths have been decided as already-tested paths. However, it is needless to say that this decision may be made when a predetermined number of signal transmission paths have been decided as already-tested paths.

Further, in this second embodiment, a delay time of each partial path on design may be a minimum value of a delay time which varies in manufacture (a delay time of high possibility of variation).

In the case where the test is terminated on the basis of a predetermined number of signal transmission paths, not only the signal transmission paths which have practically been tested but also the signal transmission paths which have been decided as already-tested paths can be confirmed. Therefore, it is possible to accurately grasp the quality of the test (i.e., how many signal transmission paths amongst all the signal transmission paths have been confirmed with respect to signal transmission).

Further, while in this second embodiment a plurality of test clocks of different timings are used, a single clock may be used.

Further, the testing process of this second embodiment is implemented by command and test program of a tester for the semiconductor IC, whereby a practical test is executed.

Further, while in this second embodiment the test timing generator is provided with the divider which divides the test clock of 200 MHz and the selector which selects either the test clock of 100 MHz or the test clock of 200 MHz, the structure of the test timing generator is not restricted thereto.

For example, the test timing generator may be provided with, instead of the divider, a delay element which is able to generate three or more kinds of test clocks having different cycles.

FIG. 5(a) is a block diagram illustrating a test timing generator 210b using such delay element.

The test timing generator 210b comprises a delay clock generator 503 which outputs a reference clock 501 with no delay, and generates first, second, and third delay clocks 503a, 503b, and 503c having different delay times on the basis of the reference clock 501; and a selector 504 which selects one of the reference clock 501 and the first to third delay clocks 503a~503c on the basis of a frequency selection signal 502, and outputs it as a test clock 505.

The delay clock generator 503 has first, second, and third delay circuits 10, 20, and 30. The first delay circuit 10 comprises one delay element D11, the second delay circuit 20 comprises two delay elements D21 and D22 which are connected in series, and the third delay circuit 30 comprises fourth delay elements D31, D32, D33, and D34 which are connected in series. These delay elements have the same delay time of signal. Accordingly, the delay time of the second delay circuit 20 is twice as long as that of the first delay circuit 10, and the delay time of the third delay circuit 30 is twice as long as that of the second delay circuit 20. The number of delay circuits having different delay times may be more than three.

Figure 6:
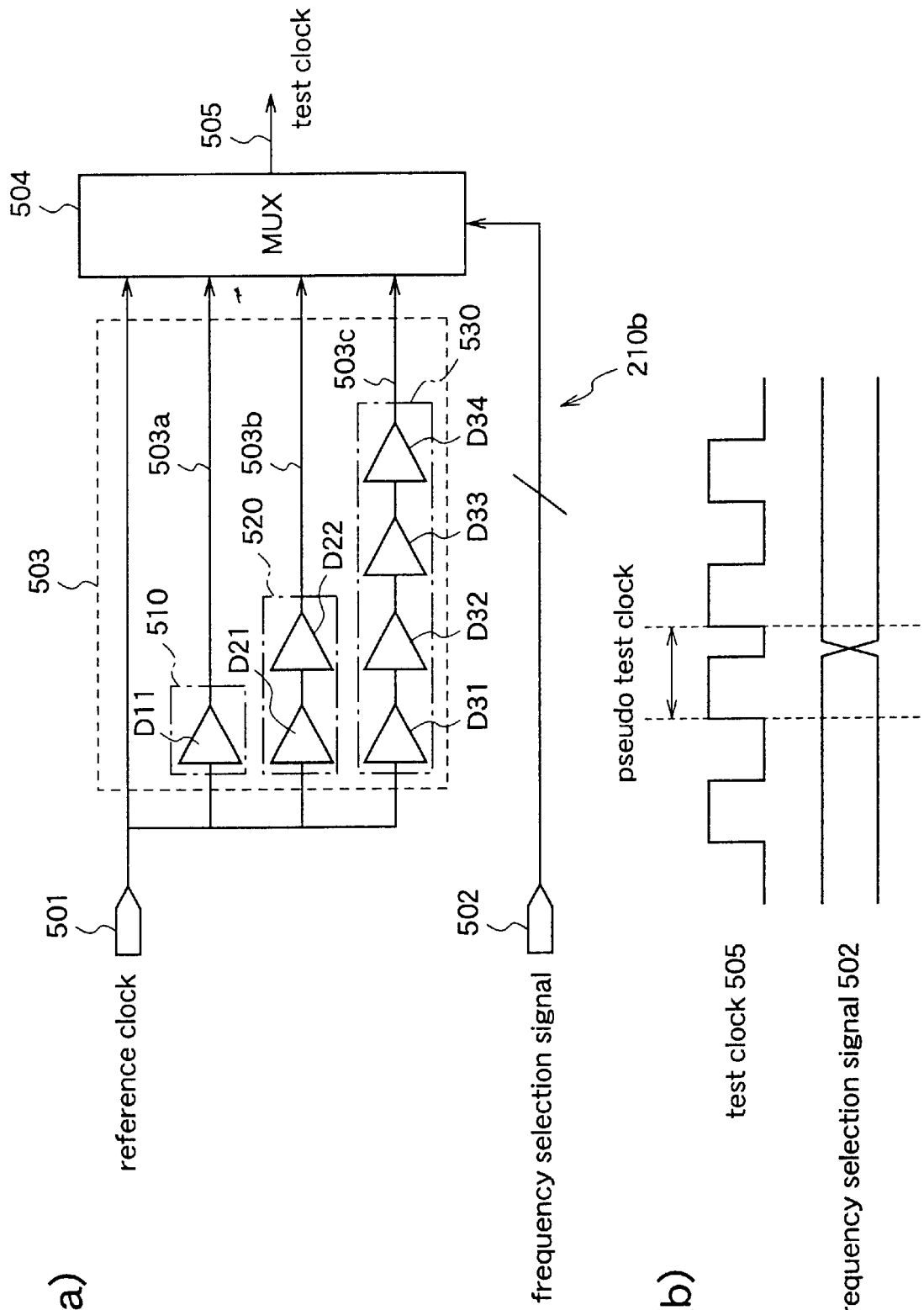
FIG. 6(a) is a block diagram illustrating a test timing generator according to a modification of the second embodiment.
FIG. 6(b) is a diagram illustrating a waveform of a test clock generator by the test timing generator.

In the delay clock generator 503 so constructed, at a predetermined timing after a time corresponding to ½ cycle of the reference clock 501 has passed from a predetermined rise timing of the reference clock 501 of cycle To (i.e., after fall), the clock selected by the selector 504 according to the frequency selection signal 502 is changed from the reference clock 501 to the third delay clock 503c, whereby a pseudo test clock 505 having a cycle different from the cycle of the reference clock 501 is output from the selector 504 (refer to FIG. 6(b)). The cycle Tg of the pseudo test clock 505 is equal to a period of time from the rise timing of the reference clock 501 to the rise timing of the third delay clock 503c. The cycle of the pseudo test clock can be changed by changing the delay clock selected by the selector 504.

In the test timing generator 210b so constructed, since the cycle of the test clock can be set more minutely than in the test timing generator 210a shown in FIG. 5, more precise (shorter) maximum delay time can be obtained for each partial path. Thereby, the sum of the maximum delay times in the target signal transmission path is reduced, and the number of signal transmission paths which are regarded as already-tested paths by the test on one target signal transmission path is increased. As the result, the number of signal transmission paths to be practically tested is reduced.

On the other hand, the advantage of the test timing generator 210a shown in FIG. 5 over the test timing generator 210b is as follows. That is, since the test timing generator 210a generates test clocks having largely different cycles, it can easily generate test clocks having cycles close to the delay times on design, for the signal transmission paths having largely different delays. It is needless to say that a test timing generator obtained by combining these test timing generators 210a and 210b has both of the advantages of these generators.

[Embodiment 3]

Figure 7:
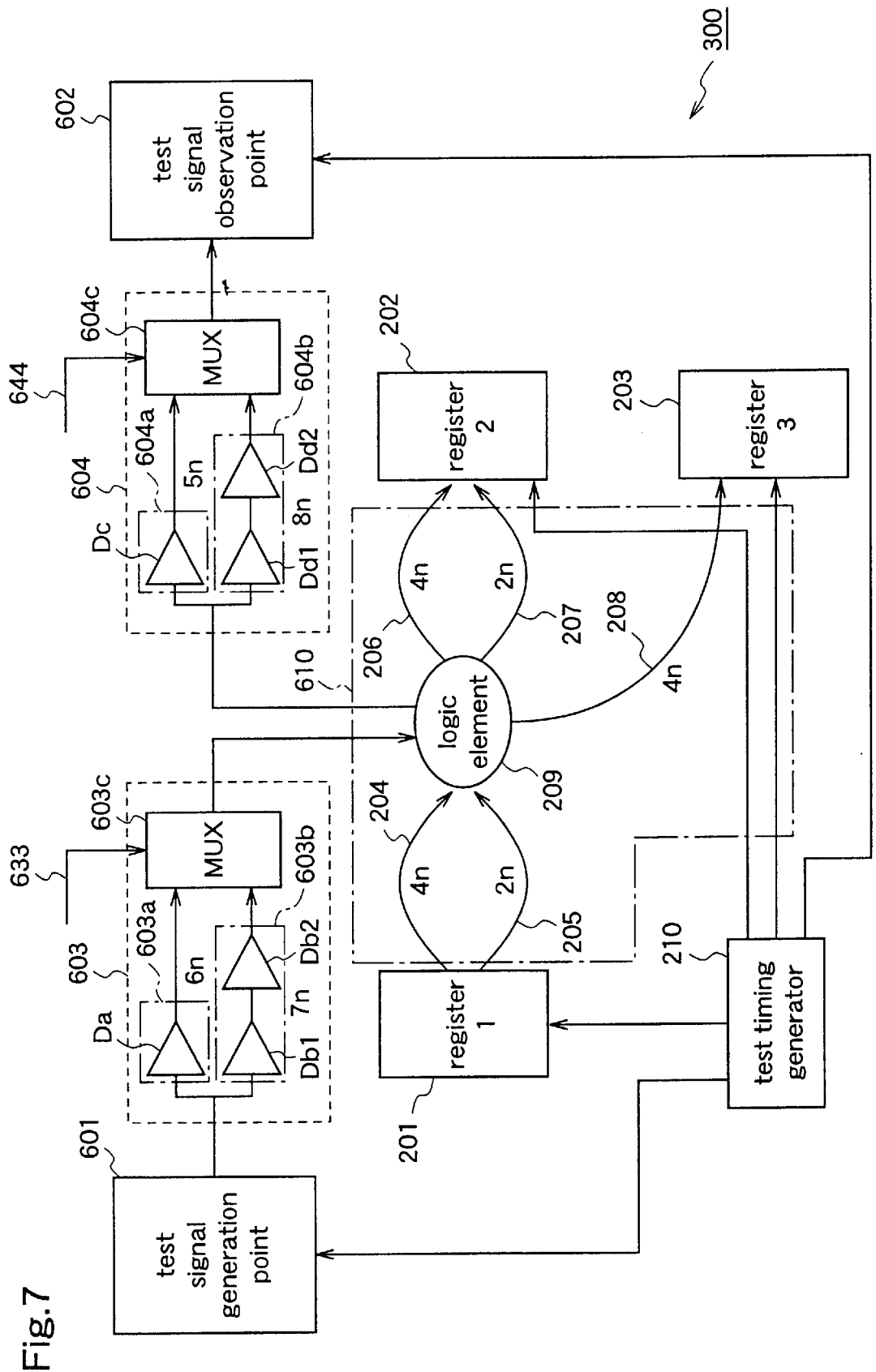
FIG. 7 is a block diagram illustrating a test circuit in a semiconductor IC according to a third embodiment of the present invention.
Figure 8:
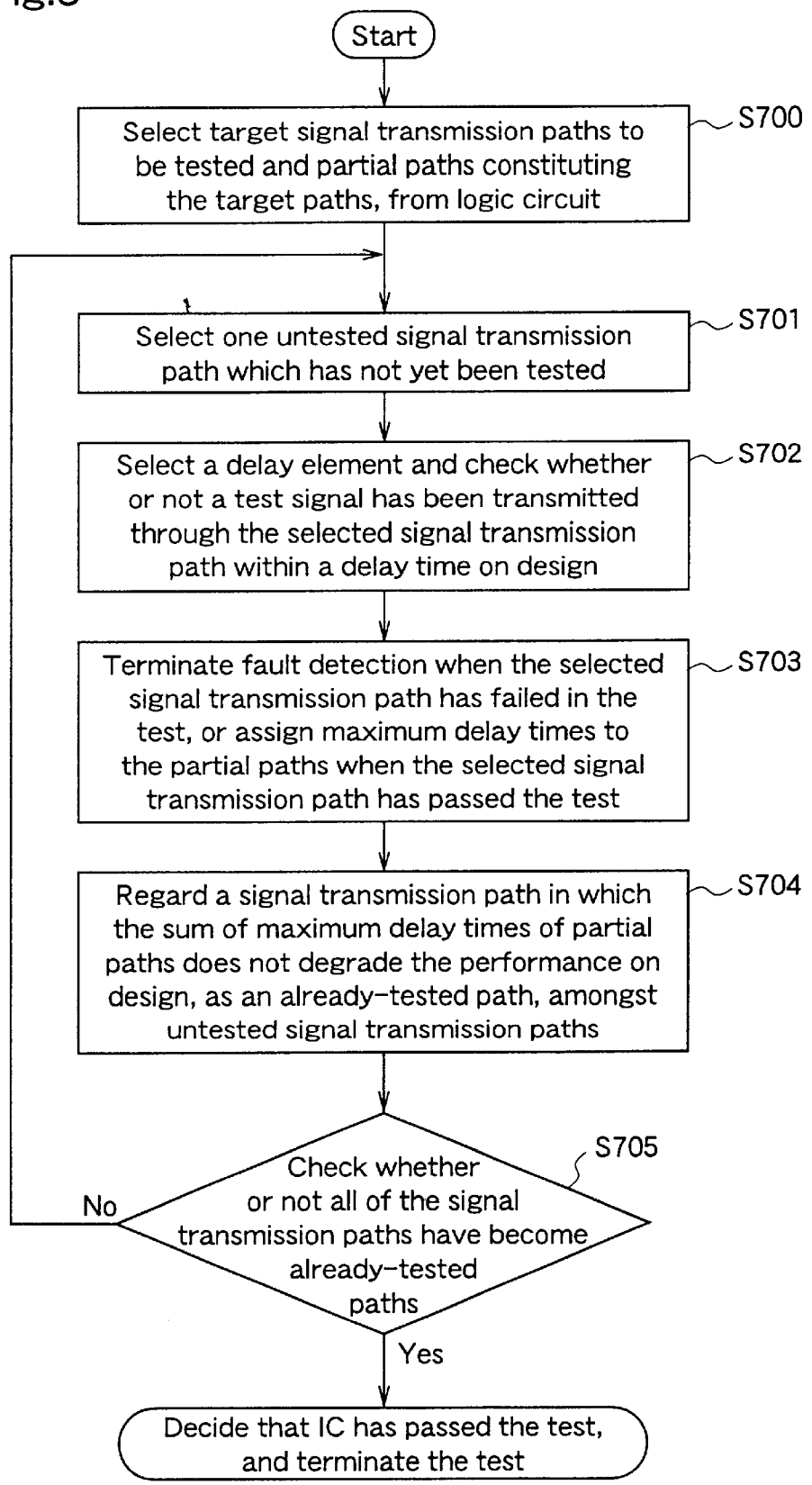
FIG. 8 is a flowchart for explaining a method of testing a semiconductor IC according to the third embodiment.

FIGS. 7 and 8 are diagrams for explaining a semiconductor IC and a method for testing the semiconductor IC according to a third embodiment of the present invention. To be specific, FIG. 7 is a block diagram illustrating a test circuit 300 in the semiconductor IC, and FIG. 7 is a flowchart of the test.

The performance of the semiconductor IC on design (on practical use) is that it can operate with a clock of 100 MHz (cycle: 10 nsec).

The test circuit 300 of the semiconductor IC circuit includes, in addition to the constituents of the test circuit 100 of the first embodiment, a second test signal generation point (additional starting-point-side register) 601 which receives the test clock supplied from the test timing generator 210 and generates a test signal; a delay unit 603 which delays the test signal supplied from the test signal generation point 601 by a predetermined period and outputs the delayed test signal to the re-convergence point 209; a second delay unit 604 which delays the test signal output from the re-convergence point 209 by a predetermined period; and a second test signal observation point (additional end-point-side register) 602 which observes the test signal output from the second delay unit 604.

The delay unit 603 comprises delay circuits 603a and 603b, and a selector 603c. The delay circuit 603a comprises one delay element Da which delays the test signal supplied from the second test signal generation point 601 by a predetermined period (6 nsec). The delay circuit 603b comprises two delay elements Db1 and Db2 connected in series, each delaying the test signal from the second test signal generation point 601 by a predetermined period (7 nsec). The selector 603c selects either the output from the delay circuit 603a or the output from the delay circuit 603b according to a delay time selection signal 633 supplied from an external tester or the like, and outputs the selected signal.

The second delay unit 604 comprises delay circuits 604a and 604b, and a selector 604c. The delay circuit 604a comprises one delay element Dc which delays the test signal from the logic element 209 (re-convergence point) by a predetermined period (5 nsec). The delay circuit 604b comprises two delay elements Dd1 and Dd2 connected in series, each delaying the test signal from the logic element 209 by a predetermined period (8 nsec). The selector 604c selects either the output from the delay circuit 604a or the output from the delay circuit 604b according to a delay time selection signal 644 supplied from the external tester or the like, and outputs the selected signal.

Next, the function and effect will be described.

Since the test circuit 300 of this third embodiment includes the second test signal generation point 601 and the second test signal observation point 602 in addition to the constituents of the test circuit 100 of the first embodiment, eleven signal transmission paths are formed in the test circuit.

The first signal transmission path comprises the partial path 204, the logic element 209, and the partial path 206. The second signal transmission path comprises the partial path 204, the logic element 209, and the partial path 207. The third signal transmission path comprises the partial path 205, the logic element 209, and the partial path 206. The fourth signal transmission path comprises the partial path 205, the logic element 209, and the partial path 207. The fifth signal transmission path comprises the partial path 204, the logic element 209, and the partial path 208. The sixth signal transmission path comprises the partial path 205, the logic element 209, and the partial path 208. The seventh signal transmission path comprises the partial path 204, the logic element 209, and the delay circuit 604. The eighth signal transmission path comprises the partial path 205, the logic element 209, and the delay circuit 604. The ninth signal transmission path comprises the delay circuit 603, the logic element 209, and the partial path 206. The tenth signal transmission path comprises the delay circuit 603, the logic element 209, and the partial path 207. The eleventh signal transmission path comprises the delay circuit 603, the logic element 209, and the partial path 208.

It is not always necessary to assure "ono delay faults" for the seventh, eighth, ninth, tenth, and eleventh signal transmission paths because these paths are unnecessary for the function of the semiconductor IC.

Hereinafter, a description will be given of the case where the test circuit of the semiconductor IC is subjected to the same test as that described for the first embodiment.

The test circuit 300 is provided with the test signal generation point 601 which supplies a test signal to the re-convergence point 209, and the test signal observation point 602 which observes the test signal from the re-convergence point. Therefore, the re-convergence point 209 serves as a test signal observation point for the partial paths 204 and 205, and the re-convergence point 209 serves as a test signal generation point for the partial paths 206, 207, and 208.

Accordingly, in this third embodiment, each of the partial paths constituting the signal transmission paths according to the first embodiment can be directly tested, whereby the number of times the test is executed is significantly reduced as compared with the case where each signal transmission path obtained by combining a predetermined partial path before the re-convergence point and a predetermined partial path after the re-convergence point is tested.

In this third embodiment, there are five partial paths 204, 205, 206, 207, and 208 to be tested practically. Therefore, by subjecting the seventh to eleventh signal transmission paths to the same test as described for the first embodiment, the first to sixth signal transmission paths are exempted from the test. As the result, the number of paths to be practically tested is reduced to five.

Next, a description will be given of the case where the same test as described for the second embodiment is performed on the test circuit 300 by using the delay units 603 and 604.

FIG. 8 is a flowchart of a test process using the delay units 603 and 604.

The test process based on this flowchart is realized by a command and a test program of a tester for the semiconductor IC, whereby a practical test is executed. Further, a test clock of 100 MHz (cycle: 10 nsec) is used for specifying operation timings to the test signal generation point and the test signal observation point.

Initially, signal transmission paths to be tested (target signal transmission paths) are selected from a plurality of signal transmission paths in the semiconductor IC. Further, the target signal transmission paths so selected are divided at the external input, the external output, or the re-convergence point, whereby partial paths constituting the target signal transmission paths are decided (step S700).

Next, in step S701, one signal transmission path which has not yet been tested (untested signal transmission path) is selected. In this case, it is assumed that the seventh signal transmission path is selected.

In step S702, the delay circuit 604a having a delay time of 5 nsec is selected from the delay unit 604 as a maximum delay element having a delay time on design being not longer than the cycle of the test clock (10 nsec). Thereby, with the delay time of the partial path 204, the delay time of the seventh signal transmission path on design becomes 9 nsec. Further, it is checked at the test signal observation point 602 whether or not the test signal has been transmitted from the test signal generation point 201 to the observation point 602 within the cycle of the test clock (10 nsec).

In step S703, when the seventh signal transmission path has failed in the test of step S702, the semiconductor IC is decided as faulty and the test is terminated. On the other hand, when the seventh signal transmission path has passed the test, a maximum delay time is obtained for the partial path 204 of the tested signal transmission path, with regard to the possibility that the delay time has increased during manufacture. When this maximum delay time is shorter than the maximum delay time which has already been assigned or when a maximum delay time has not yet been assigned, the maximum delay time obtained is assigned to the partial path.

To be specific, since the cycle of the test clock which decides the test timing is 10 nsec and the delay time on design of the second delay circuit 604*a* in the delay unit 604 is 5 nsec, 5 nsec (10 nsec–5 nsec) is assigned to the partial path 204. A delay fault in the path from the re-convergence point 209 to the test signal observation point 602 is not discussed because this path is the test path.

In step S704, an untested signal transmission path in which the sum of the maximum delay times assigned to its partial paths is shorter than the delay time which does not degrade the performance of the semiconductor IC on design (in this embodiment, 10 nsec) is regarded as an already-tested signal transmission path. When the test on the seventh signal transmission path has been completed, there is no untested signal transmission path to be regarded as an already-tested path.

In step S705, it is decided whether all of the signal transmission paths have become already-tested signal transmission paths or not. When all of the paths have been regarded as already-tested paths, it is decided that the semiconductor IC has passed the test and is of good quality with respect to the object item of the test (delay fault). On the other hand, when untested signal transmission paths still remain, the above-described processes of steps S701~S705 are repeated. In this case, since untested signal transmission paths still exist, the procedure returns to step S701.

In step S701, it is assumed that the eighth signal transmission path is selected.

In step S702, the delay circuit 604*b* having a delay time of 8nsec is selected from the delay unit 604, as a maximum delay element having a delay time on design being shorter than the cycle of the test clock (10 nsec). Then, it is checked at the test signal observation point 602 whether or not the test signal generation at the test signal generation point 201 has been transmitted to the observation point 602 within 10 nsec, and then this eighth signal transmission path is regarded as an already-tested path.

In step S703, since the cycle of the test clock indicating the test time is 10 nsec and the delay time on design of the second delay circuit 604*b* in the delay unit 604 is 8 nsec, 2 nsec (10 nsec–8 nsec) is assigned to the partial path 205 when the eighth signal transmission path has passed the test in step S702.

In step S704, a signal transmission path in which the sum of the maximum delay times assigned to its partial paths is shorter than the delay time which does not degrade the performance of the IC on design (in this embodiment, 10 nsec), is regarded as an already-tested path. However, there is no such signal transmission path yet.

Thereafter, based on the decision in step 5705, the procedure returns to step S701. Then, the ninth, tenth, and eleventh signal transmission paths are successively subjected to the loop of the processes from step S701 to step S705, and the delay times of 6 nsec, 7 nsec, and 6 nsec in the delay unit 603 are successively selected to be tested. Thereby, 4 nsec, 3 nsec, and 4 nsec are assigned as maximum delay times to the partial paths 206, 207, and 208, respectively.

Finally, in step S704, in all of the first to sixth signal transmission paths, the sum of the maximum delay times assigned to the partial paths becomes shorter than the delay time which does not degrade the performance of the IC on design (10 nsec), and all of the signal transmission paths are regarded as already-tested paths, whereby the test process is completed through the decision in step S705.

As described above, according to the third embodiment of the invention, the test circuit in the semiconductor IC is provided with the test signal generation point 601 which supplies a test signal to the re-convergence point 209 of the signal transmission paths, and the test signal observation point 602 which observes the test signal from the re-convergence point 209. A test clock generated at the test signal generation point 601 is supplied to the re-convergence point 209 through a delay circuit having a predetermined delay time, and the test signal from the re-convergence point 209 is output to the test signal observation point through a delay circuit having a predetermined delay time. Therefore, the maximum delay time of each partial path can be made precise (small) using less kinds of test clocks. Thereby, the sum of the maximum delay times in the signal transmission path is reduced, and the number of signal transmission paths to be regarded as already-tested paths increases. As the result, the number of signal transmission paths to be practically tested is reduced.

Generally, by increasing the kinds of delay elements and adjusting the delay time of each target path on design so that it approaches the cycle of the test clock, the target signal transmission path can be tested by using less kinds of test clocks.

In the logic circuit according to this third embodiment, all of the signal transmission paths between the starting point register and the end point register re-converge at the re-convergence point. However, a predetermined number of signal transmission paths among the signal transmission paths between the starting point register and the end point register may re-converge at the re-convergence point. Further, while in this third embodiment only one re-convergence point exists between the starting point register and the end point register, there may exist plural re-convergence points. In this case, each of the plural re-convergence points is not necessarily provided with a starting point register and an end point register, and at least one re-convergence point may be provided with a starting point register and an end point register.

Further, while in this third embodiment a single test clock of $\phi$MHz is used, a plurality of test clocks may be used as described for the second embodiment. Also in this case, the number of signal transmission paths to be tested is reduced.

Further, in the aforementioned embodiments, to simplify the description, it is not described that the delay time due to signal change at the rise of the test signal is different from that at the fall of the test signal. However, when the delay time at the rise of the test signal is different from that at the fall, these delay times can be checked separately.

[Embodiment 4]

Figure 9:
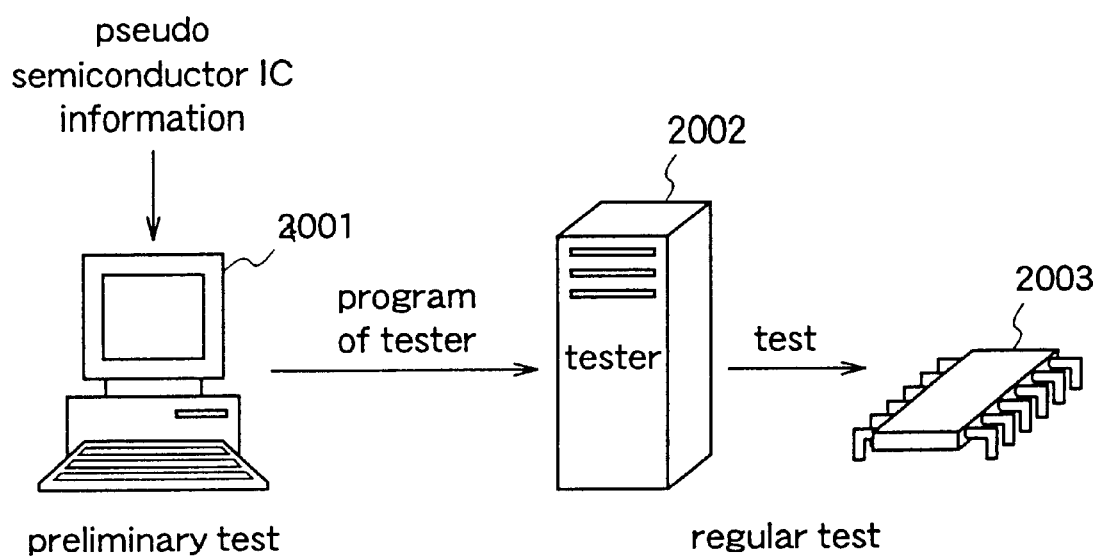
FIG. 9 is a diagram for explaining a method of testing a semiconductor IC by using a program of a tester, which is formed in a computer on the basis of a pseudo semiconductor IC, according to fourth to sixth embodiments of the present invention.
Figure 10:
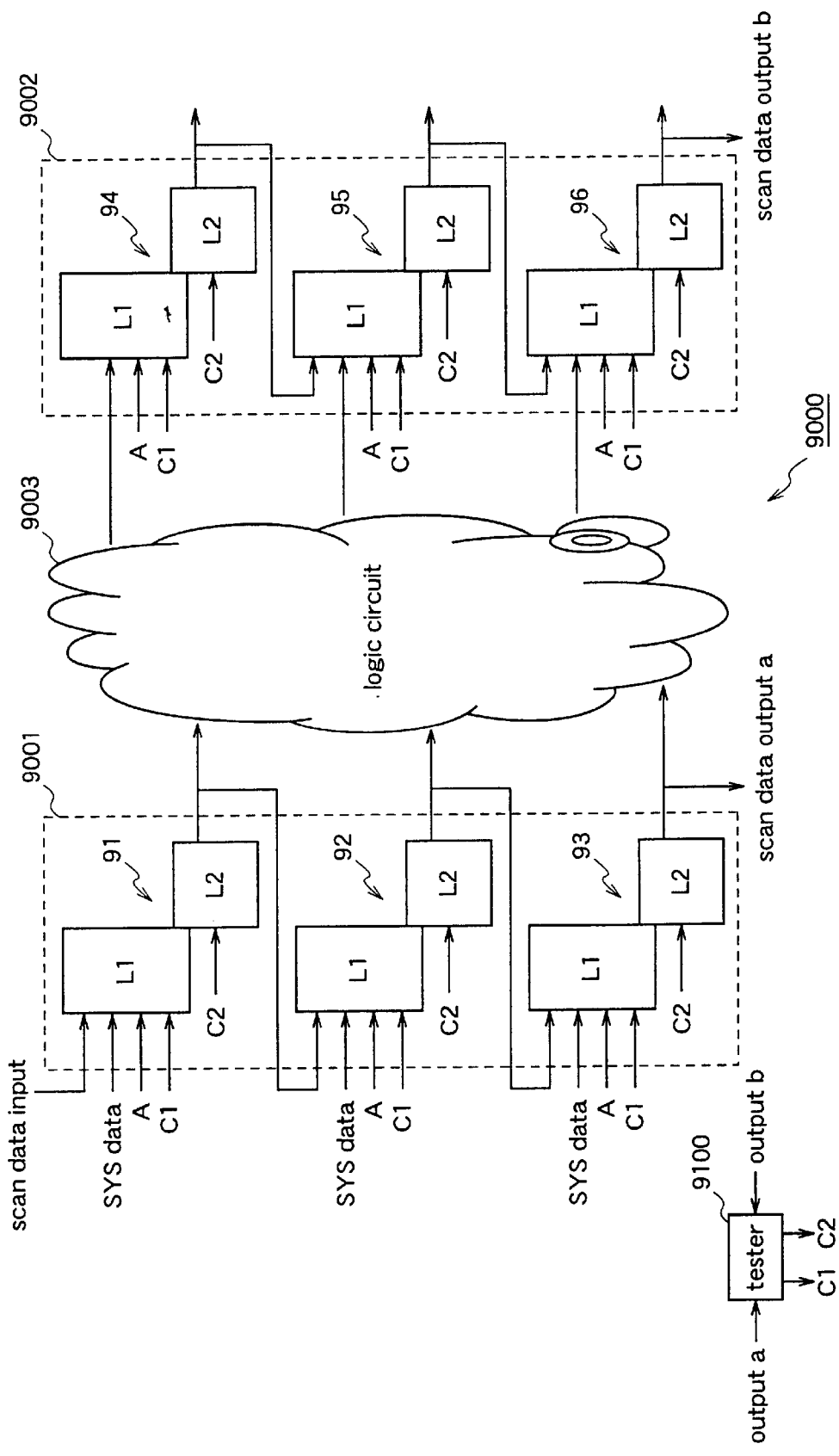
FIG. 10 is a diagram illustrating a test circuit in a semiconductor IC according to the prior art.
Figure 11:
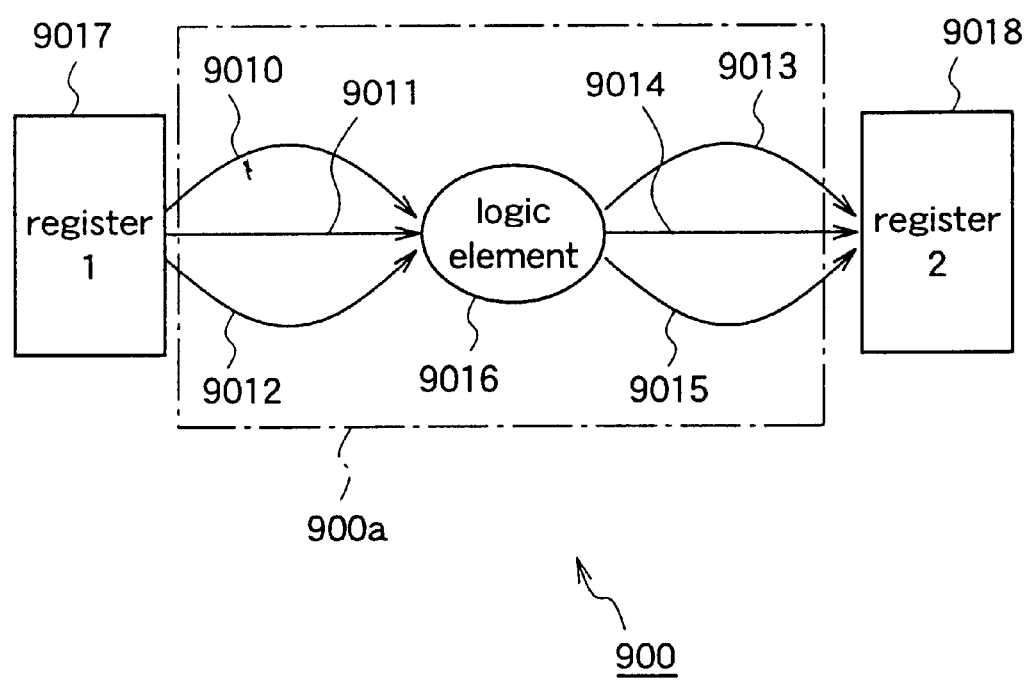
FIG. 11 is a diagram for explaining the program that the number of signal transmission paths to be test increases in a method of testing a semiconductor IC according to the prior art.

FIG. 9 is a diagram for explaining a method of testing a semiconductor IC according to a fourth embodiment of the present invention. In each of the aforementioned embodiments of the present invention, a real semiconductor IC is subjected to detection of faults in signal transmission paths. In this fourth embodiment, however, as shown in FIG. 9, a pseudo semiconductor IC having the same structure as that of a real semiconductor IC 2003 is constructed in a computer 2001, and the pseudo semiconductor IC is subjected to a pseudo (preliminary) test according to the same process as described for the first embodiment, and the real semiconductor IC 2003 is tested on the basis of the result of the pseudo test.

To be specific, in the pseudo semiconductor IC constructed in the computer 2001, the delay times of signal transmission paths A, B, C, D, E, and F are checked by using the same method as described for the first embodiment. As a pseudo program of a tester which tests the pseudo semiconductor IC constructed in the computer 2001, a program which has been created on assumption that the pseudo semiconductor IC has no faults is used so that all of target signal transmission paths are tested. In other words, since all of the partial paths constituting the target signal transmission paths in the pseudo semiconductor circuit are regarded as having no faults, the target signal transmission paths are not subjected to the delay decision process in which a timing signal is input to the registers on the starting point side and the end point side of the target signal transmission path according to the delay time on design which is set for the target path, and then it is decided whether or not the test signal generated in the starting point register has been transmitted to the end point register within a measured time according to the delay time on design.

Now it is assumed that, as the result of the test on the pseudo semiconductor IC, the signal transmission path C is decided as a path that needs no test from the result of the test on the signal transmission paths A and B, and the signal transmission path F is decided as a path that needs no test from the result of the test on the signal transmission paths D and E.

In this case, the signal transmission paths A, B, D, and E have practically been tested while the signal transmission paths C and F have not been practically tested. Therefore, as a program of a tester 2002 which tests the real semiconductor IC 2003, a program for checking the delay times of the signal transmission paths A, B, D, and E is created, and the signal transmission paths A, B, D, and E in the real semiconductor IC 2003 are tested by using this program. In this case, the process of deciding that the signal transmission paths C and F in the real semiconductor IC 2003 need no test, is not performed.

If the real semiconductor IC has delay faults in signal transmission paths, the semiconductor IC is decided as being faulty in the test process.

As described above, according to the fourth embodiment of the invention, the pseudo semiconductor IC constructed in the computer and having the same structure as that of the real semiconductor IC is subjected to the pseudo test by using the method according to the first embodiment, and the real semiconductor IC is tested on the basis of the result of the pseudo test. Therefore, semiconductor ICs in mass production can be tested with high efficiency.

[Embodiment 5]

Next, a method of testing a semiconductor IC according to a fifth embodiment of the present invention will be described with reference to FIG. 9. In this fifth embodiment, a pseudo semiconductor IC having the same structure as that of a real semiconductor IC 2003 is constructed in a computer 2001, and the pseudo semiconductor IC is subjected to a pseudo test according to the same method as described for the second embodiment, and the real semiconductor IC 2003 is tested on the basis of the result of the pseudo test.

As described above, according to the fifth embodiment, the pseudo semiconductor IC constructed in the computer and having the same structure as that of the real semiconductor IC is subjected to the pseudo test according to the method of the second embodiment as described for the fourth embodiment, and the real semiconductor IC is tested on the basis of the result of the pseudo test. Therefore, semiconductor ICs in mass production can be tested with high efficiency.

[Embodiment 6]

Next, a method of testing a semiconductor IC according to a sixth embodiment of the present invention will be described with reference to FIG. 9. In this sixth embodiment, a pseudo semiconductor IC having the same structure as that of a real semiconductor IC 2003 is constructed in a computer 2001, and the pseudo semiconductor IC is subjected to a pseudo test according to the same method as described for the third embodiment, and the real semiconductor IC 2003 is tested on the basis of the result of the pseudo test.

As described above, according to the sixth embodiment, the pseudo semiconductor IC constructed in the computer and having the same structure as that of the real semiconductor IC is subjected to the pseudo test according to the method of the third embodiment as described for the fourth embodiment, and the real semiconductor IC is tested on the basis of the result of the pseudo test. Therefore, semiconductor ICs in mass production can be tested with high efficiency.

In the case where the pseudo semiconductor IC constructed in the computer 2001 is tested for the delay times in the signal transmission paths by using the method of the third embodiment, the pseudo semiconductor IC has the starting point register and the end point register which are connected to the re-convergence point, like the real semiconductor IC of the third embodiment.

As described above, according to the aforementioned embodiments of the present invention, the existence of a delay fault is checked for each of plural partial paths which are components of signal transmission paths in a semiconductor IC. Therefore, the number of signal transmission paths to be practically tested can be reduced as compared with the conventional testing method in which all of the signal transmission paths in the semiconductor IC should be practically tested. As the result, the time required for the test is reduced.

Further, a test signal generation point (additional starting-point-side register) and a test signal observation point (additional end-point-side register) are added to a re-convergence point of the signal transmission paths. Therefore, the apparent number of signal transmission paths can be reduced, whereby the time required for the test is reduced.

Further, a maximum delay time is obtained for each partial path, and a signal transmission path in which the sum of the maximum delay times of its partial paths does not degrade the performance of the semiconductor IC is regarded as an already-tested path. Therefore, the time required for the test is reduced in both cases where a test clock of a single cycle is used and where a predetermined number of test clocks having different cycles are used.

Further, first and second delay units, each including a plurality of delay circuits having different delay times, are connected between the test signal generation point and the re-convergence point and between the re-convergence point and the test signal observation unit, respectively. Therefore, the number of signal transmission paths to be tested can be reduced by selecting any of the delay circuits even when using less kinds of test clocks, whereby an inexpensive tester which is limited in the kinds of available clocks can be employed.

Furthermore, a pseudo semiconductor IC having the same structure as a real semiconductor IC is constructed in a computer, and signal transmission paths in this pseudo semiconductor IC are subjected to a pseudo test. On the basis of the result of the pseudo test, signal transmission paths in the real semiconductor IC are subjected to an actual test. Therefore, the test on the signal transmission paths in the real semiconductor IC can be performed with high efficiency.

What is claimed is:

1. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

delay decision step of inputting the timing signal to registers on the starting point side and the end point side of a target signal transmission path to be subjected to the test, at an interval according to a delay time on design which is set for the target signal transmission path, and deciding whether or not a test signal generated in the starting-point-side register has been transmitted to the end-point-side register within the delay time on design;

fault decision step of deciding that all of partial paths which are components of the target signal transmission path and are separated by a logic element on the path, are not faulty when the test signal has reached the end-point-side register within the delay time on design; and already-tested-path decision step of deciding that an untested signal transmission path comprising only the partial paths which have been decided as being not faulty is an already-tested signal transmission path for which no test is required.

2. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

path selection step of selecting an untested signal transmission path which has not yet been subjected to the test, as a target signal transmission path, from a predetermined number of signal transmission paths to be subjected to the test which are positioned between said two registers;

delay decision step of inputting the timing signal to registers on the starting point side and the end point side of the target signal transmission path, at an interval according to a delay time on design which is set for the target signal transmission path, and detecting whether or not a test signal generated in the starting-point-side register has been transmitted to the end-point-side register within the delay time on design, and deciding that the target signal transmission path is an already-tested signal transmission path;

fault decision step of deciding that the semiconductor IC has a fault in the target signal transmission path and terminating the test when the test signal has not reached the end-point-side register within the delay time on design, and deciding that all of partial paths which are components of the target signal transmission path and are separated by a logic element on the path, are not faulty when the test signal has reached the end-point-side register within the delay time on design; and already-tested-path decision step of deciding that, amongst the plural signal transmission paths to be subjected to the test, an untested signal transmission path comprising only the partial paths which have been decided as being not faulty is an already-tested signal transmission path for which no test is required;

wherein said path selection step, said delay decision step, said fault decision step, and said tested-path decision step are repeated until all of the predetermined number of signal transmission paths to be subjected to the test have been decided as already-tested signal transmission paths.

3. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

delay decision step of detecting whether or not a test signal generated in a starting-point-side register of a target signal transmission path to be subjected to the test has been transmitted to an end-point-side register within an allowable delay time based on the performance of the semiconductor IC on design;

maximum delay time derivation step of deriving maximum delay times for partial paths which are components of the target signal transmission path and are separated by a logic element on the path, on the basis of the allowable delay time and the delay times of the respective partial paths on design, when the test signal has reached the end-point-side register within the allowable delay time; and already-tested-path decision step of deciding that an untested signal transmission path which comprises only the partial paths to which the maximum delay times are assigned and has the sum of the maximum delay times of the respective partial paths being shorter than the allowable delay time, is an already-tested signal transmission path for which no test is required.

4. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

path selection step of selecting an untested signal transmission path which has not yet been subjected to the test, as a target signal transmission path, from a predetermined number of signal transmission paths to be subjected to the test which are positioned between said two registers;

delay decision step of detecting whether or not a test signal generated in a starting-point-side register of the target signal transmission path has been transmitted to an end-point-side register within an allowable delay time based on the performance of the semiconductor IC on design, and deciding that the target signal transmission path is an already-tested signal transmission path;

maximum delay time derivation step of deciding that the semiconductor IC has a fault in the target signal transmission path and terminating the test when the test signal has not reached the end-point-side register within the allowable delay time, and deriving maximum delay times for partial paths which are components of the target signal transmission path and are separated by a logic element on the path, on the basis of the allowable delay time and the delay times of the respective partial paths on design, when the test signal has reached the end-point-side register within the allowable delay time;

delay time assignment step of assigning the derived maximum delay time to the partial path whose maximum delay time derived is smaller than a maximum delay time which has already been assigned or to the partial path to which no maximum delay time has not yet been assigned, amongst the partial paths constituting the target signal transmission path; and already-tested-path decision step of deciding that, amongst the plural signal transmission paths to be subjected to the test, an untested signal transmission path which comprises only the partial paths to which the maximum delay times are assigned and has the sum of the maximum delay times of the respective partial paths being shorter than the allowable delay time is an already-tested signal transmission path for which no test is required;

wherein said path selection step, said delay decision step, said maximum delay time derivation step, said delay time assignment step, and said already-tested-path decision step are repeated until all of the predetermined number of signal transmission paths to be subjected to the test have been regarded as already-tested signal transmission paths.

5. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

delay decision step of selecting a clock signal as said timing signal from plural clock signals having different cycles, said clock signal having a minimum cycle that is not shorter than a delay time on design which is set for a target signal transmission path to be subjected to the test, and inputting the timing signal to registers on the starting point side and the end point side of the target signal transmission path, and detecting whether or not a test signal generated in the starting-point-side register of the target signal transmission path has been transmitted to the end-point-side register within the minimum cycle;

maximum delay time derivation step of deriving maximum delay times for partial paths which are components of the target signal transmission path and are separated by a logic element on the path, on the basis of the minimum cycle and the delay times of the respective partial paths on design, when the test signal has reached the end-point-side register within the minimum cycle; and already-tested-path decision step of deciding that an untested signal transmission path which comprises only the partial paths to which the maximum delay times are assigned and has the sum of the maximum delay times of the respective partial paths being shorter than an allowable delay time based on the performance of the semiconductor IC on design, is an already-tested signal transmission path for which no test is required.

6. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

path selection step of selecting an untested signal transmission path which has not yet been subjected to the test, as a target signal transmission path, from a predetermined number of signal transmission paths to be subjected to the test, positioned between said two registers;

delay decision step of selecting a clock signal as said timing signal from plural clock signals having different cycles, said clock signal having a minimum cycle that is not shorter than a delay time on design which is set for the target signal transmission path, and inputting the timing signal to registers on the starting point side and the end point side of the target signal transmission path, and then detecting whether or not a test signal generated in the starting-point-side register of the target signal transmission path has been transmitted to the end-point-side register within the minimum cycle, and thereafter, deciding that the target signal transmission path is an already-tested signal transmission path;

maximum delay time derivation step of deciding that the semiconductor IC has a fault in the target signal transmission path and terminating the test when the test signal has not reached the end-point-side register within the minimum cycle, and deriving maximum delay times for partial paths which are components of the target signal transmission path and are separated by a logic element on the path, on the basis of the minimum cycle and the delay times of the respective partial paths on design, when the test signal has reached the end-point-side register within the minimum cycle;

delay time assignment step of assigning the derived maximum delay time to the partial path whose maximum delay time derived is smaller than a maximum delay time which has already been assigned or to the partial path to which no maximum delay time has not yet been assigned, amongst the partial paths constituting the target signal transmission path; and already-tested-path decision step of deciding that, amongst the plural signal transmission paths to be subjected to the test, an untested signal transmission path which comprises only the partial paths to which the maximum delay times are assigned and has the sum of the maximum delay times of the respective partial paths being shorter than an allowable delay time based on the performance of the semiconductor IC on design, is an already-tested signal transmission path for which no test is required;

wherein said path selection step, said delay decision step, said maximum delay time derivation step, said delay time assignment step, and said already-tested-path decision step are repeated until all of the predetermined number of signal transmission paths to be subjected to the test have been regarded as already-tested signal transmission paths.

7. A semiconductor IC having a plurality of registers which hold input signals according to a timing signal, and a logic circuit which includes a plurality of signal transmission paths and exchanges signals with predetermined registers, said logic circuit including:

a plurality of signal transmission paths positioned between predetermined two registers;

a logic element forming a re-convergence point at which part or all of the plural signal transmission paths re-converge between said two registers;

one of said two registers being a starting-point-side register which generates a test signal when performing detection of faults in the signal transmission paths while the other register being an end-point-side register which receives the test signal output from the starting-point-side register through the signal transmission paths; and said logic element being connected with either or both of an additional starting-point-side register which outputs a test signal to the logic element when performing detection of faults in the signal transmission paths and an additional end-point-side register which receives the test signal output from the logic element.

8. The semiconductor IC of claim 7 further including:

a test timing generator which outputs a test clock to each of the registers, as a timing signal for deciding a timing at which the starting-point-side register or the additional starting-point-side register generates a test signal and a timing at which the end-point-side register or the additional end-point-side register observes the test signal; and said test timing generator generating a test clock having a predetermined cycle, on the basis of a timing selection signal supplied from the outside.

9. The semiconductor IC of claim 7 wherein:

said logic circuit further includes a starting-point-side delay circuit which comprises a plurality of delay circuits having different delay times and is connected between said logic element forming the re-convergence point and said additional starting-point-side register outputting the test signal to the logic element; and said test signal output from the additional starting-point-side register is transmitted to the logic element through a specific delay circuit in the starting-point-side delay circuit.

10. The semiconductor IC of claim 7 wherein:

said logic circuit further includes an end-point-side delay circuit which comprises a plurality of delay circuits having different delay times and is connected between said logic element forming the re-convergence point and said additional end-point-side register receiving the test signal output from the logic element; and said test signal output from the logic element is transmitted to the additional end-point-side register through a specific delay circuit in the end-point-side delay circuit.

11. The semiconductor IC testing method according to claim 1, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

12. A method for subjecting the semiconductor IC of claim 9 to a test for detecting faults in plural signal transmission paths which are positioned between the starting-point-side register and additional starting-point-side register, and the end-point-side register, and between the starting-point-side register, and the end-point-side register and additional end-point-side register, said method comprising:

delay decision step of generating a test signal according to a timing signal by the starting-point-side register or the additional starting-point-side register of a target signal transmission path to be subjected to the test, and detecting whether or not the test signal has been transmitted to the end-point-side register or the additional end-point-side register within an allowable delay time based on the performance of the semiconductor IC on design, according to the timing signal;

maximum delay time derivation step of deriving maximum delay times for partial paths which are components of the target signal transmission path and are separated at the logic element on the path, on the basis of the allowable delay time and the delay times of the respective partial paths on design, when the test signal has been transmitted within the allowable delay time; and already-tested-path decision step of deciding that an untested signal transmission path which comprises only the partial paths to which the maximum delay times are assigned and has the sum of the maximum delay times of the partial paths being shorter than the allowable delay time is an already-tested signal transmission path for which no test is required;

wherein, in said delay decision step, when generating the test signal by the starting-point-end register, a delay circuit is selected from the starting-point-side delay circuit, said delay circuit selected having a maximum delay time within a range in which the delay time on design between the additional starting-point-side register and the end-point-side register does not exceed a measured time which is decided according to the timing signal.

13. A method for subjecting the semiconductor IC of claim 10 to a test for detecting faults in plural signal transmission paths which are positioned between the starting-point-side register and additional starting-point-side register, and the end-point-side register, and between the starting-point-side register, and the end-point-side register and additional end-point-side register, said method comprising:

delay decision step of generating a test signal according to a timing signal by the starting-point-side register or the additional starting-point-side register of a target signal transmission path to be subjected to the test, and detecting whether or not the test signal has been transmitted to the end-point-side register or the additional end-point-side register within an allowable delay time based on the performance of the semiconductor IC on design, according to the timing signal;

maximum delay time derivation step of deriving maximum delay times for partial paths which are components of the target signal transmission path and are separated at the logic element on the path, on the basis of the allowable delay time and the delay times of the respective partial paths on design, when the test signal has been transmitted within the allowable delay time; and already-tested-path decision step of deciding that an untested signal transmission path which comprises only the partial paths to which the maximum delay times are assigned and has the sum of the maximum delay times of the partial paths being shorter than the allowable delay time is an already-tested signal transmission path for which no test is required;

wherein, in said delay decision step, when observing the test signal by the additional end-point-side register, a delay circuit is selected from the end-point-side delay circuit, said delay circuit selected having a maximum delay time within a range in which the delay time on design between the starting-point-side register and the additional end-point-side register does not exceed a measured time which is decided according to the timing signal.

14. A method for subjecting the semiconductor IC of claim 9 to a test for detecting faults in plural signal transmission paths which are positioned between the starting-point-side register and additional starting-point-side register, and the end-point-side register, and between the starting-point-side register, and the end-point-side register and additional end-point-side register, said method comprising:

delay decision step of selecting a clock signal as a timing signal from plural clock signals having different cycles, said clock signal having a minimum cycle that is not shorter than a delay time on design which is set for a target signal transmission path to be tested, and inputting the timing signal into the starting-point-side and end-point-side registers of the target signal transmission path, and then detecting whether or not the test signal generated in the starting-point-side register or the additional starting-point-side register of the target signal transmission path has been transmitted to the end-point-side register or the additional end-point-side register within the minimum cycle;

maximum delay time derivation step of deriving maximum delay times for partial paths which are components of the target signal transmission path and are separated at the logic element on the path, on the basis of the minimum cycle and the delay times of the respective partial paths on design, when the test signal has been transmitted within the minimum cycle; and already-tested-path decision step of deciding that an untested signal transmission path which comprises only the partial paths to which the maximum delay times are assigned and has the sum of the maximum delay times of the partial paths being shorter than an allowable delay time based on the performance of the semiconductor IC on design, is an already-tested signal transmission path for which no test is required;

wherein, in said delay decision step, when generating the test signal by the starting-point-end register, a delay circuit is selected from the starting-point-side delay circuit, said delay circuit selected having a maximum delay time within a range in which the delay time on design between the additional starting-point-side register and the end-point-side register does not exceed a measured time which is decided according to the timing signal.

15. A method for subjecting the semiconductor IC of claim 10 to a test for detecting faults in plural signal transmission paths which are positioned between the starting-point-side register and additional starting-point-side register, and the end-point-side register, and between the starting-point-side register, and the end-point-side register and additional end-point-side register, said method comprising:

delay decision step of selecting a clock signal as a timing signal from plural clock signals having different cycles, said clock signal having a minimum cycle that is not shorter than a delay time on design which is set for a target signal transmission path to be tested, and inputting the timing signal into the starting-point-side and end-point-side registers of the target signal transmission path, and then detecting whether or not the test signal generated in the starting-point-side register or the additional starting-point-side register of the target signal transmission path has been transmitted to the end-point-side register or the additional end-point-side register within the minimum cycle;

maximum delay time derivation step of deriving maximum delay times for partial paths which are components of the target signal transmission path and are separated at the logic element on the path, on the basis of the minimum cycle and the delay times of the respective partial paths on design, when the test signal has been transmitted within the minimum cycle; and already-tested-path decision step of deciding that an untested signal transmission path which comprises only the partial paths to which the maximum delay times are assigned and has the sum of the maximum delay times of the partial paths being shorter than an allowable delay time based on the performance of the semiconductor IC on design, is an already-tested signal transmission path for which no test is required;

wherein, in said delay decision step, when observing the test signal by the additional end-point-side register, a delay circuit is selected from the end-point-side delay circuit, said delay circuit selected having a maximum delay time within a range in which the delay time on design between the additional starting-point-side register and the end-point-side register does not exceed a measured time which is decided according to the timing signal.

16. A semiconductor IC having a plurality of registers which hold input signals according to a timing signal, and a logic circuit which includes a plurality of signal transmission paths and exchanges signals with predetermined registers, said logic circuit including:
a plurality of signal transmission paths positioned between predetermined two registers;
a logic element forming a re-convergence point at which part or all of the plural signal transmission paths re-converge between the two registers; and
one of the two registers being a starting-point-side register which generates a test signal when performing detection of faults in the signal transmission paths while the other register being an end-point-side register which receives the test signal output from the starting-point-side register through the signal transmission paths; and said semiconductor IC further including:
a test timing generator for generating a test clock for deciding a timing at which the starting-point-side register generates the test signal and a timing at which the end-point-side register observes the test signal, and outputting the test clock to the respective registers; and said test timing generator generating a test clock of a predetermined frequency on the basis of a timing selection signal supplied from the outside.

17. The semiconductor IC of claim 16 wherein:

said test timing generator has a plurality of dividers having different division ratios, for dividing a reference clock having a fixed frequency to generate divided clocks; and said test timing generator outputs the reference clock or a divided clock obtained by a predetermined divider, as the test clock, on the basis of the timing selection signal.

18. The semiconductor IC of claim 16 wherein:

said test timing generator has a plurality of delay circuits having different delay times, for delaying a reference clock having a fixed frequency to generate delayed clocks; and said test timing generator generates a pseudo test clock having a cycle shorter than that of the reference clock, by changing the reference clock or the delayed clock, which is to be output as the test clock, to another delayed clock after rise or fall of the reference clock, according to the timing selection signal.

19. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

preliminary test step of performing a preliminary test on a pseudo semiconductor IC which is constituted by a computer and has the same structure as that of the semiconductor IC; and regular test step of performing a regular test on the real semiconductor IC, on the basis of the result of the preliminary test;

said preliminary test step including:

path selection step of selecting an untested signal transmission path which has not yet been tested, as a target signal transmission path, from a predetermined number of signal transmission paths to be tested which are positioned between two registers in the pseudo semiconductor IC; and decision step of deciding that all of partial paths which are components of the target signal transmission path and are separated at a logic element on the path, have no faults, and deciding that an untested signal transmission path comprising only the partial paths having no faults is an already-tested signal transmission path for which no test is required; and said regular test step including:

delay decision step of inputting a timing signal to registers on the starting point side and the end point side of a signal transmission path in the real semiconductor IC, which corresponds to a signal transmission path in the pseudo semiconductor IC other than the signal transmission path that has been decided as an already-tested path in the decision step of the preliminary test, at an interval according to a delay time on design which is set for the signal transmission path, and detecting whether or not a test signal generated in the starting-point-side register has been transmitted to the end-point-side register within the delay time on design.

20. A method for subjecting a semiconductor IC which has a plurality of registers holding input signals according to a timing signal, and a logic circuit including a plurality of signal transmission paths and exchanging signals with predetermined registers, to a test for detecting faults in plural signal transmission paths positioned between two registers, said method comprising:

preliminary test step of performing a preliminary test on a pseudo semiconductor IC which is constructed by a computer and has the same structure as that of the semiconductor IC; and regular test step of performing a regular test on the real semiconductor IC, on the basis of the result of the preliminary test;

said preliminary test step including:

path selection step of selecting an untested signal transmission path which has not yet been tested, as a target signal transmission path, from a predetermined number of signal transmission paths to be tested which are positioned between two registers in the pseudo semiconductor IC; and maximum delay time derivation step of deriving maximum delay times for partial paths which are components of the target signal transmission path and are separated by a logic element on the path, on the basis of an allowable delay time based on the performance of the semiconductor IC and the delay times of the respective partial paths on design; and decision step of deciding that an untested signal transmission path which comprises only the partial paths to which the maximum delay times are assigned and has the sum of the maximum delay times of the partial paths being shorter than the allowable delay time, is an already-tested signal transmission path for which no test is needed; and said regular test step including:

delay decision step of inputting a timing signal to registers on the starting point side and the end point side of a signal transmission path in the real semiconductor IC, which corresponds to a signal transmission path in the pseudo semiconductor IC other than the signal transmission path that has been decided as an already-tested path in the decision step of the preliminary test, at an interval according to an allowable delay time based on the performance on design which is set for the signal transmission path, and detecting whether or not a test signal generated in the starting-point-side register has been transmitted to the end-point-side register within the allowable delay time.

21. The semiconductor IC testing method according to claim 19 wherein:

each of said pseudo semiconductor IC and said real semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers being a starting-point-side register which generates a test signal when performing detection of faults in the signal transmission paths while the other register being an end-point-side register which receives the test signal output from the starting-point-side register through the signal transmission paths; and said logic element being connected with either or both of an additional starting-point-side register which outputs a test signal to the logic element when performing detection of faults in the signal transmission paths and an additional end-point-side register which receives the test signal output from the logic element.

22. The semiconductor IC testing method according to claim 2, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

23. The semiconductor IC testing method according to claim 3, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

24. The semiconductor IC testing method according to claim 4, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

25. The semiconductor IC testing method according to claim 5, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

26. The semiconductor IC testing method according to claim 6, wherein:

said semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers is a starting-point-side register which generates a test signal when performing detection of faults in the signal transmission paths while the other register is an end-point-side register which receives the test signal output from the starting-point-side register through the signal transmission paths;

said logic element is connected with either or both of an additional starting-point-side register which outputs a test signal to the logic element when performing detection of faults in the signal transmission paths and an additional end-point-side register which receives the test signal output from the logic element; and part or all of the signal transmission paths positioned between the starting-point-side register and the end-point-side register are subjected to the test by using the starting-point-side register, the end-point-side register, and either or both of the additional starting-point-side register and the additional end-point-side register.

27. The semiconductor IC testing method according to claim 20 wherein:

each of said pseudo semiconductor IC and said real semiconductor IC includes, as said logic circuit, a logic circuit having a plurality of signal transmission paths positioned between predetermined two registers, and a logic element forming a re-convergence point at which part or all of the plural signal transmission paths re-converge between the two registers;

one of said two registers being a starting-point-side register which generates a test signal when performing detection of faults in the signal transmission paths while the other register being an end-point-side register which receives the test signal output from the starting-point-side register through the signal transmission paths; and said logic element being connected with either or both of an additional starting-point-side register which outputs a test signal to the logic element when performing detection of faults in the signal transmission paths and an additional end-point-side register which receives the test signal output from the logic element.

\* \* \* \* \*